(12) United States Patent
Yamazaki et al.

(10) Patent No.: US 9,711,110 B2
(45) Date of Patent: Jul. 18, 2017

(54) DISPLAY DEVICE COMPRISING GRAYSCALE CONVERSION PORTION AND DISPLAY PORTION

(71) Applicant: Semiconductor Energy Laboratory Co., Ltd., Kanagawa-ken (JP)

(72) Inventors: Shunpei Yamazaki, Tokyo (JP); Yoshiharu Hirakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 350 days.

(21) Appl. No.: 13/833,870

(22) Filed: Mar. 15, 2013

(65) Prior Publication Data
US 2013/0265320 A1    Oct. 10, 2013

(30) Foreign Application Priority Data

Apr. 6, 2012    (JP) ................. 2012-087818

(51) Int. Cl.
| | | |
|---|---|---|
| G09G 5/02 | (2006.01) |
| H04N 13/00 | (2006.01) |
| G06F 3/042 | (2006.01) |
| H01L 51/52 | (2006.01) |
| H01L 27/32 | (2006.01) |

(Continued)

(52) U.S. Cl.
CPC ............. G09G 5/02 (2013.01); G06F 3/0421 (2013.01); H04N 13/0018 (2013.01); H04N 13/0033 (2013.01); *G09G 3/003* (2013.01); *G09G 3/3208* (2013.01); *G09G 2320/0271* (2013.01);

(Continued)

(58) Field of Classification Search
CPC ...................................................... G09G 5/02
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 102385844 A | 3/2012 |
| EP | 1 085 495 A2 | 3/2001 |

(Continued)

OTHER PUBLICATIONS

International Search Report re application No. PCT/JP2013/058894, dated Jul. 2, 2013.

(Continued)

*Primary Examiner* — Kee M Tung
*Assistant Examiner* — Grace Q Li
(74) *Attorney, Agent, or Firm* — Husch Blackwell LLP

(57) ABSTRACT

A dark portion in an image seen by a viewer is expressed more precisely, whereby the image given a greater sense of depth is displayed. A display device in which pixels each include a light-emitting module capable of emitting light having a spectral line half-width of less than or equal to 60 nm in a response time of less than or equal to 100 μs and are provided at a resolution of higher than or equal to 80 ppi; the NTSC ratio is higher than or equal to 80%; and the contrast ratio is higher than or equal to 500, is provided with a circuit converting an image signal having a given grayscale into an image signal capable of representing an image on the low luminance side by high-level grayscale.

30 Claims, 12 Drawing Sheets

(51) Int. Cl.
*G09G 3/00* (2006.01)
*G09G 3/3208* (2016.01)

(52) U.S. Cl.
CPC ........ *H01L 27/322* (2013.01); *H01L 51/5265* (2013.01); *H01L 51/5278* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,053,868 B1 | 5/2006 | Kojima et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,420,203 B2 | 9/2008 | Tsutsui et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,466,292 B2 | 12/2008 | Kojima et al. |
| 7,468,304 B2 | 12/2008 | Kaji et al. |
| 7,473,923 B2 | 1/2009 | Tsutsui et al. |
| 7,501,293 B2 | 3/2009 | Ito et al. |
| 7,580,085 B2 | 8/2009 | Jacobs et al. |
| 7,674,650 B2 | 3/2010 | Akimoto et al. |
| 7,732,819 B2 | 6/2010 | Akimoto et al. |
| 7,956,349 B2 | 6/2011 | Tsutsui et al. |
| 7,956,353 B2 | 6/2011 | Tsutsui et al. |
| 8,118,633 B2 | 2/2012 | Yuasa |
| 8,222,061 B2* | 7/2012 | Xu .......................... B22F 9/026 257/E31.038 |
| 8,279,230 B2 | 10/2012 | Nose et al. |
| 8,294,143 B2 | 10/2012 | Imai et al. |
| 8,319,714 B2 | 11/2012 | Kojima et al. |
| 8,849,045 B2 | 9/2014 | Furihata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0017162 A1* | 1/2004 | Sato ................... H01L 27/3276 315/169.3 |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0098024 A1 | 5/2006 | Kohno |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0138945 A1* | 6/2006 | Wolk et al. .................... 313/506 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0024773 A1 | 2/2007 | Yamada et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0176161 A1 | 8/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0222743 A1* | 9/2007 | Hirakata ............... G09G 3/3413 345/102 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0238294 A1 | 10/2008 | Xu et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284719 A1 | 11/2008 | Yoshida |
| 2008/0296568 A1 | 12/2008 | Ryu et al. |
| 2008/0297031 A1 | 12/2008 | Takahashi et al. |
| 2009/0041348 A1 | 2/2009 | Someya et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0001637 A1* | 1/2010 | Satou ............................ 313/504 |
| 2010/0039011 A1* | 2/2010 | Karaki et al. ...................... 313/1 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0330738 A1* | 12/2010 | Uchiyama ............... C04B 35/453 438/104 |
| 2011/0127521 A1* | 6/2011 | Yamazaki ............ H01L 21/0242 257/43 |
| 2011/0157209 A1* | 6/2011 | Saito ............................ 345/589 |
| 2011/0227119 A1 | 9/2011 | Tsutsui et al. |
| 2011/0227121 A1 | 9/2011 | Tsutsui et al. |
| 2011/0242420 A1* | 10/2011 | Lou ............................... 348/607 |
| 2011/0254037 A1 | 10/2011 | Arasawa |
| 2011/0291088 A1 | 12/2011 | Seo et al. |
| 2012/0001291 A1* | 1/2012 | Kokumai .............. H01L 27/14609 257/443 |
| 2012/0044216 A1* | 2/2012 | Furihata et al. ............... 345/204 |
| 2012/0099048 A1 | 4/2012 | Yamazaki et al. |
| 2012/0175601 A1 | 7/2012 | Imai et al. |
| 2012/0223346 A1 | 9/2012 | Ohsawa et al. |
| 2012/0243219 A1* | 9/2012 | Ohsawa et al. ............... 362/230 |
| 2012/0286305 A1* | 11/2012 | Sasaki et al. ................... 257/89 |
| 2013/0015476 A1 | 1/2013 | Imai et al. |
| 2013/0076775 A1 | 3/2013 | Kojima et al. |

(56) References Cited

U.S. PATENT DOCUMENTS

| | | |
|---|---|---|
| 2013/0076864 A1 | 3/2013 | Takahashi et al. |
| 2013/0264549 A1 | 10/2013 | Yamazaki et al. |

FOREIGN PATENT DOCUMENTS

| | | | |
|---|---|---|---|
| EP | 1 737 044 A1 | 12/2006 | |
| EP | 2 226 847 A2 | 9/2010 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-268794 A | 10/1996 | |
| JP | 11-505377 | 5/1999 | |
| JP | 2000-044236 A | 2/2000 | |
| JP | 2000-150900 A | 5/2000 | |
| JP | 2001-092409 A | 4/2001 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-115389 | 4/2006 | |
| JP | 2008-277264 A | 11/2008 | |
| JP | 2008-287118 | 11/2008 | |
| JP | 2009-44500 | 2/2009 | |
| JP | 2009-158140 A | 7/2009 | |
| JP | 2010-15785 | 1/2010 | |
| JP | 2010-160509 A | 7/2010 | |
| JP | 2011-018554 A | 1/2011 | |
| JP | 2011-090894 A | 5/2011 | |
| JP | 2011-238908 | 11/2011 | |
| WO | WO 2004/003630 A1 | 1/2004 | |
| WO | WO 2004/114391 A1 | 12/2004 | |

OTHER PUBLICATIONS

Written Opinion re application No. PCT/JP2013/058894, dated Jul. 2, 2013.

Chinese Office Action re Application No. CN 201380017742.9, dated Feb. 19, 2016.

Chinese Office Action re Application No. CN 201380017742.9, dated Sep. 27, 2016.

Coates, D. et al., "Optical Studies of the Amorphous Liquid-Cholesteric Liquid Crystal Transistion: The Blue Phase," Physics Letters, Sep. 10, 1973, vol. 45A, No. 2, pp. 115-116.

Meiboom, S. et al., "Theory of the Blue Phase of Cholesteric Liquid Crystals," Physical Review Letters, May 4, 1981, vol. 46, No. 18, pp. 1216-1219.

Costello, M.J. et al., "Electron Microscopy of a Cholesteric Liquid Crystal and its Blue Phase," Physical Review. A, May 1, 1984, vol. 29, No. 5, pp. 2957-2959.

Kimizuka, N. et al., "Spinel, YbFe2O4, and Yb2Fe3O7 Types of Structures for Compounds in the In2O3 and SC2O3-A2O3-BO Systems [A; Fe, Ga, or Al; B; Mg, Mn, Fe, Ni, Cu, or Zn] at Temperatures Over 1000° C.," Journal of Solid State Chemistry, 1985, vol. 60, pp. 382-384.

Nakamura, M. et al., "The Phase Relations in the In2O3-Ga2ZnO4-ZnO System at 1350° C.," Journal of Solid State Chemistry, Aug. 1, 1991, vol. 93, No. 2, pp. 298-315.

Kitzerow, H-S. et al., "Observation of Blue Phases in Chiral Networks," Liquid Crystals, 1993, vol. 14, No. 3, pp. 911-916.

Kimizuka, N. et al., "Synthesis and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Prins, M.W.J. et al., "A Ferroelectric Transparent Thin-Film Transistor," Applied Physics Letters, Jun. 17, 1996, vol. 68, No. 25, pp. 3650-3652.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Kikuchi, H. et al., "Polymer-Stabilized Liquid Crystal Blue Phases," Nature Materials, Sep. 2, 2002, vol. 1, pp. 64-68.

Tsuda, K. et al., "Ultra Low Power Consumption Technologies for Mobile TFT-LCDs," IDW'02: Proceedings of the 9th International Display Workshops, Dec. 4, 2002, pp. 295-298.

Nomura, K. et al., "Thin-Film Transistor Fabricated in Single-Crystalline Transparent Oxide Semiconductor," Science, May 23, 2003, vol. 300, No. 5623, pp. 1269-1272.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Lee, H.N. et al., "Current Status of, Challenges to, and Perspective View of AM-OLED," IDW '06: Proceedings of the 13th International Display Workshops, Dec. 7, 2006, pp. 663-666.

Hosono, H., "68.3 Invited Paper:Transparent Amorphous Oxide Semiconductors for High Performance TFT," SID Digest '07: SID International Symposium Digest of Technical Papers, 2007, vol. 38, pp. 1830-1833.

Hirao, T. et al., "Novel Top-Gate Zinc Oxide Thin-Film Transistors (ZnO TFTs) For AMLCDS," Journal of the Society for Information Display, 2007, vol. 15, No. 1, pp. 17-22.

Park, S. et al., "Challenge to Future Displays: Transparent AM-OLED Driven by Peald Grown ZnO TFT," IMID '07 Digest, 2007, pp. 1249-1252.

Kikuchi, H. et al., "62.2: Invited Paper:Fast Electro-Optical Switching In Polymer-Stabilized Liquid Crystalline Blue Phases for Display Application," SID Digest '07: SID International Symposium Digest of Technical Papers, 2007, vol. 38, pp. 1737-1740.

Miyasaka, M., "SUFTLA Flexible Microelectronics on Their Way to Business," SID Digest '07: SID International Symposium Digest of Technical Papers, 2007, vol. 38, pp. 1673-1676.

Kurokawa, Y. et al., "UHF RFCPUS on Flexible and Glass Substrates for Secure RFID Systems," Journal of Solid-State Circuits, 2008, vol. 43, No. 1, pp. 292-299.

Jeong, J.K. et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Park, J-S. et al., "Amorphous Indium—Gallium—Zinc Oxide TFTs and Their Application for Large Size AMOLED," AM-FPD '08 Digest of Technical Papers, Jul. 2, 2008, pp. 275-278.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Sakata, J. et al., "Development of 4.0-In. AMOLED Display with Driver Circuit Using Amorphous In-Ga-Zn-Oxide TFTs," IDW '09: Proceedings of the 16th International Display Workshops, 2009, pp. 689-692.

(56) References Cited

OTHER PUBLICATIONS

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Nowatari, H. et al., "60.2: Intermediate Connector with Suppressed Voltage Loss for White Tandem OLEDS," SID Digest '09: SID International Symposium Digest of Technical Papers, May 31, 2009, vol. 40, pp. 899-902.

Jin, D-U. et al., "65.2: Distinguished Paper:World-Largest (6.5") Flexible Full Color Top Emission AMOLED Display on Plastic Film and its Bending Properties," SID Digest '09: SID International Digest of Technical Papers, May 31, 2009, pp. 983-985.

Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho, D-H. et al., "21.2:Al and Sn-Doped Zinc Indium Oxide Thin Film Transistors for AMOLED Back-Plane," SID Digest '09: SID International Symposium Digest of Technical Papers, May 31, 2009, pp. 280-283.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Osada, T. et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Ohara, H. et al., "21.3: 4.0 IN. QVGA AMOLED Display Using In-Ga-ZN-Oxide TFTs with a Novel Passivation Layer," SID Digest '09: SID International Symposium Digest of Technical Papers, May 31, 2009, pp. 284-287.

Godo, H. et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Osada, T. et al., "Development of Driver-Integrated Panel Using Amorphous In-Ga-Zn-Oxide TFT," AM-FPD '09 Digest of Technical Papers, Jul. 1, 2009, pp. 33-36.

Godo, H. et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Ohara H. et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Park, J.C. et al., "High Performance Amorphous Oxide Thin Film Transistors with Self-Aligned Top-Gate Structure,"IEDM 09: Technical Digest of International Electron Devices Meeting, Dec. 7, 2009, pp. 191-194.

Nakamura, M. "Synthesis of Homologous Compound with New Long-Period Structure," NIRIM Newsletter, Mar. 1, 1995, vol. 150, pp. 1-4.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Orita, M. et al., "Mechanism of Electrical Conductivity of Transparent InGaZnO4," Physical Review. B, Jan. 15, 2000, vol. 61, No. 3, pp. 1811-1816.

Van de Walle, C.G., "Hydrogen as a Cause of Doping in Zinc Oxide," Physical Review Letters, Jul. 31, 2000, vol. 85, No. 5, pp. 1012-1015.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Janotti, A. et al., "Oxygen Vacancies In ZnO," Applied Physics Letters, 2005, vol. 87, pp. 122102-1-122102-3.

Clark, S.J. et al., "First Principles Methods Using CASTEP," Zeitschrift fur Kristallographie, 2005, vol. 220, pp. 567-570.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Janotti, A. et al., "Native Point Defects IN ZnO," Physical Review. B, Oct. 4, 2007, vol. 76, No. 16, pp. 165202-1-165202-22.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Hsieh, H-H. et al., "P-29: Modeling of Amorphous Oxide Semiconductor Thin Film Transistors and Subgap Density of States, " SID Digest '09: SID International Symposium Digest of Technical Papers, May 20, 2008, vol. 39, pp. 1277-1280.

Oba, F. et al., "Defect Energetics in ZnO: A Hybrid Hartree-Fock Density Functional Study," Physical Review. B, 2008, vol. 77, pp. 245202-1-245202-6.

Kim, S. et al., "High-Performance Oxide Thin Film Transistors Passivated by Various Gas Plasmas," 214th ECS Meeting, 2008, No. 2317, ECS.

Hayashi, R. et al., "42.1: Invited Paper: Improved Amorphous In—Ga—Zn—O TFTS," SID Digest '08: SID International Symposium Digest of Technical Papers, May 20, 2008, vol. 39, pp. 621-624.

Son, K-S. et al., "42.4L: Late-News Paper: 4 Inch QVGA AMOLED Driven by the Threshold Voltage Controlled Amorphous GIZO (Ga2O3-In2O3-ZnO) TFT," SID Digest '08: SID International Symposium Digest of Technical Papers, May 20, 2008, vol. 39, pp. 633-636.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Fung, T.C. et al., "2-D Numerical Simulation of High-Performance Amorphous In—Ga—Zn—O TFTs for Flat Panel Displays," AM-FPD '08 Digest of Technical Papers, Jul. 2, 2008, pp. 251-252, The Japan Society of Applied Physics.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Asakuma, N. et al., "Crystallization and Reduction of SOL-GEL-Derived Zinc Oxide Films by Irridation with Ultraviolet Lamp," Journal Of SOL-GEL Science and Technology, 2003, vol. 26, pp. 181-184.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Oh, M.S. et al., "Improving the Gate Stability of ZnO Thin-Film Transistors with Aluminum Oxide Dielectric Layers," Journal of the Electrochemical Society, 2008, vol. 155, No. 12, pp. H1009-H1014.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Ueno, K. et al., "Field-Effect Transistor on SrTiO3 with Sputtered Al2O3 Gate Insulator," Applied Physics Letters, Sep. 1, 2003, vol. 83, No. 9, pp. 1755-1757.

(56) References Cited

OTHER PUBLICATIONS

Nomura, K. et al., "Carrier Transport in Transparent Oxide Semiconductor with Intrisic Structural Randomness Probed Using Single-Crystalline InGaO3(ZnO)5 Films," Applied Physics Letters, Sep. 13, 2004.

* cited by examiner

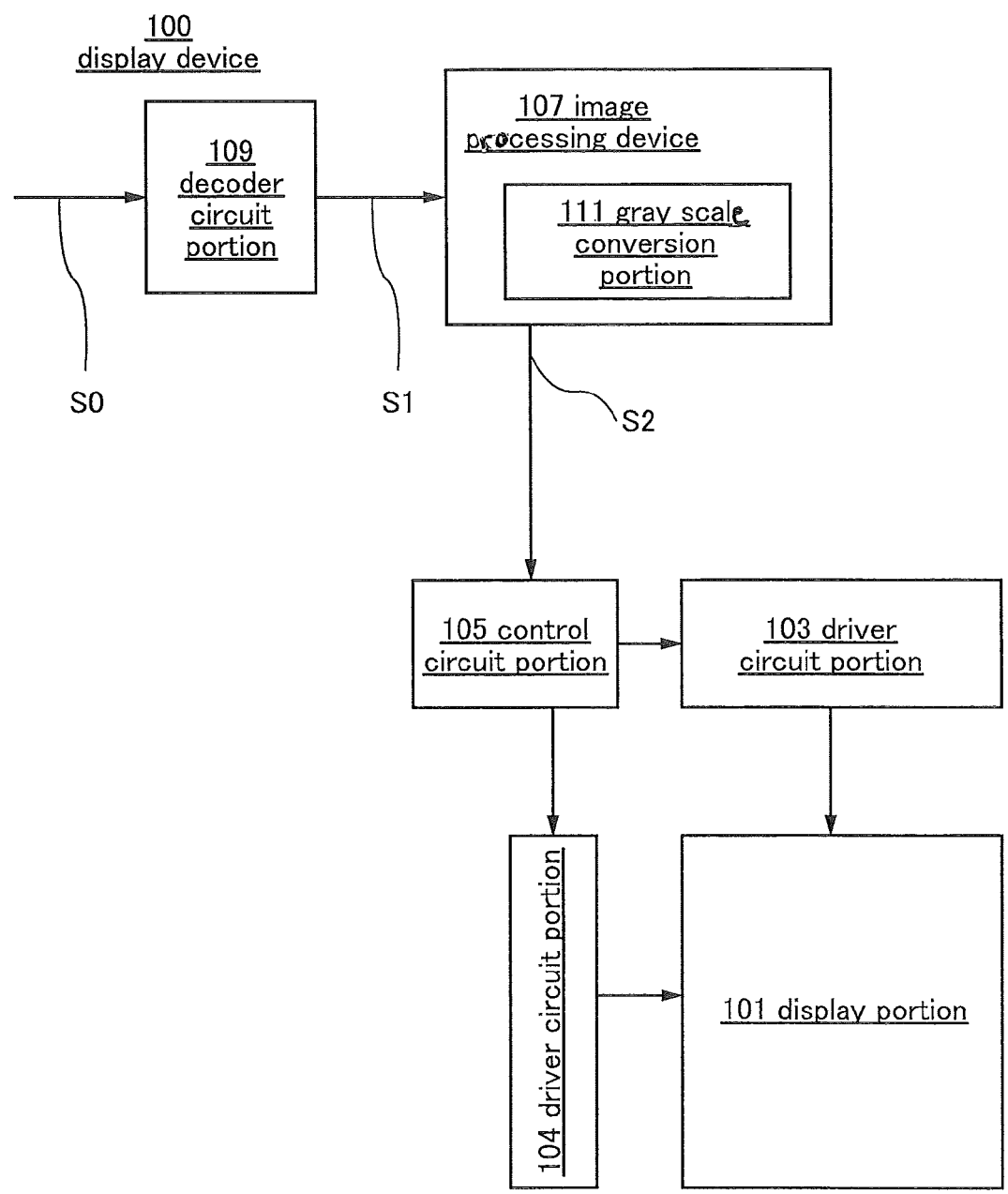

DISPLAY DEVICE COMPRISING GRAYSCALE CONVERSION PORTION AND DISPLAY PORTION

TECHNICAL FIELD

The present invention relates to a display device. The present invention relates to an electronic device including a display device.

BACKGROUND ART

A display device that displays a stereoscopic image using a binocular parallax is known. Such a display device is configured to display, on one screen, an image to be seen from the position of the left eye of a viewer (an image for left eye) and an image to be seen from the position of the right eye of the viewer (an image for right eye). The viewer sees the image for left eye with the left eye and the image for right eye with the right eye and is thus allowed to see a stereoscopic image.

For example, in a glasses system, an image for left eye and an image for right eye are alternately displayed on a screen of a display device in synchronization with a shutter provided in a pair of glasses, whereby the left eye of a viewer is allowed to see only the image for left eye and the right eye of the viewer is allowed to see only the image for right eye. Thus, the viewer can see a stereoscopic image.

Further, in a display device using a parallax barrier system which allows a viewer to see a stereoscopic image with naked eyes, a screen is divided into many regions (e.g., strip-like regions). The regions are alternately allocated to the region for right eye and the region for left eye, and a parallax barrier is provided to overlap with the boundaries of the regions. In each the divided region, an image for right eye is displayed on the region for right eye, and an image for left eye is displayed on the region for left eye. With the parallax barrier, the regions for displaying the image for right eye are hidden from the left eye of a viewer and the regions for displaying the image for left eye are hidden from the right eye of the viewer; consequently, the left eye is allowed to see only the image for left eye and the right eye is allowed to see only the image for right eye. Thus, the viewer can see a stereoscopic image with the naked eyes.

Note that a display device including a switchable parallax barrier for achieving switching between a flat image display mode and a stereoscopic image display mode is known (Patent Document 1).

In addition, a light-emitting element in which a layer containing a light-emitting organic compound is provided between a pair of electrodes is known. This light-emitting element is a self-luminous type; therefore, high contrast and high speed of response to an input signal are achieved. A display device to which this light-emitting element is applied is known (Patent Document 2).

REFERENCE

Patent Document

[Patent Document 1] PCT International Publication No. WO2004/003630
[Patent Document 2] Japanese Published Patent Application No. 2011-238908

DISCLOSURE OF INVENTION

In the case of using a display device that displays a stereoscopic image using a binocular parallax, a distance between a screen of the display device and the left/right eye of a viewer is almost uniform regardless of an image displayed. Therefore, in some cases, a distance between a viewer and a screen on which the left/right eye of the viewer is focused is different from a distance, which provides a binocular parallax, between the viewer and the object in an image displayed on the screen. Thus, there has been a problem in that the difference has caused strain on the viewer.

The present invention is made in view of the foregoing technical background. Therefore, an object of the present invention is to provide a display device that can display an image which causes a viewer less strain associated with viewing and gives a viewer a sense of great depth. Another object is to provide an electronic device for enjoying an image which causes a viewer less strain associated with viewing and gives a viewer a sense of great depth.

In order to solve any of the above objects, one embodiment of the present invention is made with a focus on a depth effect by monocular viewing. This leads to a display device having a structure exemplified in this specification.

In addition, the present inventors found that a dark portion in an image seen by a viewer is expressed more precisely, thereby giving the image a greater sense of depth. Then, the present inventors conceived to add a circuit for converting an image contained in an image signal (also referred to as image source) which is inputted to a display device of one embodiment of the present invention to an image giving a viewer a greater sense of depth.

When a viewer sees a real object, the viewer can perceive a texture of the surface of the object and can experience a stereoscopic effect even by monocular viewing, by reflection of light and dark on a surface of the object. Further, the viewer can perceive the positional relation between the object and the backdrop from luminance gradient in a shaded portion which is a light-blocked portion by the object and focused onto the backdrop. Accordingly, in an image displayed in the display device, a dark portion is particularly expressed more precisely, thereby displaying images which can give a viewer a rich sense of depth.

A conventional image signal has a given grayscale and represents grayscale linearly from the lowest luminance to the highest luminance in accordance with a dynamic range of luminance a display device can have. However, in a conventional image expressed by a constant luminance interval without distinction between a dark portion and a light portion, luminance difference of a dark portion cannot be reproduced precisely; thus, such an image is difficult to give a viewer a sense of depth and perceived as a flat image.

Thus, an image signal having a given grayscale needs to be converted into an image signal capable of representing an image on the low luminance side by high-level grayscale.

Thus, one embodiment of the present invention is a display device including a display portion and a grayscale conversion portion. The display portion has an NTSC ratio of 80% or higher and a contrast ratio of 500 or higher. In the display portion, pixels each including a light-emitting module capable of emitting light with a spectral line half-width of 60 nm or less within a response time of less than or equal to 100 μs are provided at a resolution of 80 ppi or more. The grayscale conversion portion converts a first image signal inputted to the grayscale conversion portion into a second image signal and transmits the second image signal to the display portion. The first image signal has p gray levels (p is a natural number). The second image signal is subjected to grayscale conversion processing in which each q gray levels from the lowest luminance to the q-th value in the first image signal is further divided into $2^r$ value. Here, q is greater than or equal to 1 and less than or equal to p/2 and r is greater than or equal to 1 and less than or equal to 20.

In the display portion included in such a display device, the distribution of light and shade in an image can be widened and thus a detailed image can be displayed. Further, an image which is faithful to camerawork can be displayed smoothly. Accordingly, a viewer is given a greater sense of depth by monocular vision, which can eliminate the need for displaying images including a binocular parallax on one screen. In addition, a viewer can see an image with naked eyes. As a result, it is possible to reduce strain on a viewer which is caused by viewing and to display an image which allows a viewer to have a great sense of depth.

Further, the pixel includes the light-emitting module which emits light with a narrow spectral line half-width and high color purity; therefore, the NTSC ratio is high and the contrast is high. Thus, an image with a wide grayscale range can be displayed. Since the pixel includes the light-emitting element having a short response time, an image in motion can be displayed smoothly. Thus, a moving image in which a front image moves smoothly and faster than a back image while overlapping with the back image can be expressed. The wide grayscale range and the smooth motion interact with each other, which allows a viewer to see an image with a strong sense of depth.

Further, the number of gray levels is increased in the low luminance regions using the grayscale conversion portion, whereby a dark portion can be precisely expressed. Combining with the above-described display portion can synergistically widen the distribution of light and shade in an image; thus, a texture of a surface of an object, shading of a shaded portion formed by the object, and the like can be faithfully reproduced. Thus, an image which can give a viewer a rich sense of depth can be displayed.

Another embodiment of the present invention includes a display portion and a grayscale conversion portion. The display portion has an NTSC ratio of 80% or higher and a contrast ratio of 500 or higher. In the display portion, pixels each including a light-emitting module capable of emitting light with a spectral line half-width of 60 nm or less within a response time of less than or equal to 100 μs are provided at a resolution of 80 ppi or more. The light-emitting module includes a reflective film; a semi-transmissive and semi-reflective film; a light-emitting element provided between the reflective film and the semi-transmissive and semi-reflective film, and including a pair of electrodes, a plurality of layers containing a light-emitting organic compound between the pair of electrodes, and an interlayer between the layers containing light-emitting organic compounds; and a color filter overlapping with the light-emitting element with the semi-transmissive and semi-reflective film provided therebetween. The grayscale conversion portion converts a first image signal inputted to the grayscale conversion portion into a second image signal and transmits the second image signal to the display portion. The first image signal hasp gray levels (p is a natural number). The second image signal is subjected to grayscale conversion processing in which each q gray levels from the lowest luminance to the q-th value is further divided into $2^r$ value. Here, q is greater than or equal to 1 and less than or equal to p/2 and r is greater than or equal to 1 and less than or equal to 20.

With such a structure, light interferes with each other between the reflective film and the semi-transmissive and semi-reflective film, a specific light among light with a wavelength of 400 nm or higher and lower than 800 nm is strengthened, and unnecessary light are absorbed by the color filter. Accordingly, high color saturation images can be displayed by light with a narrow spectral line width (specifically, 60 nm or less), thereby giving a viewer a greater sense of depth. Consequently, it is possible to provide a display device that can display images which cause a viewer less strain associated with viewing and give a viewer a sense of great depth.

In any of the display devices according to another embodiment of the present invention, the grayscale conversion portion divides an image contained in a first image signal into a plurality of regions, extracts luminance distribution in each region, determines whether to perform grayscale conversion processing in each region based on the luminance distribution, and performs grayscale conversion processing to the region which needs the grayscale conversion processing.

With such a structure, grayscale conversion processing is performed not in all the regions of the image contained in the first image signal but in the region which needs the grayscale conversion processing. Thus, processing rate in the grayscale conversion portion can be increased. Further, since the grayscale conversion portion does not perform grayscale conversion processing in a region which does not need the processing, driving power consumption of the display device can be reduced.

In any of the display devices according to another embodiment of the present invention, a light-emitting module provided in a pixel is a first light-emitting module including a color filter transmitting light exhibiting red and a reflective film and a semi-transmissive and semi-reflective film between which the optical path length is adjusted to i/2 times (i is a natural number) the length greater than or equal to 600 nm and less than 800 nm, a second light-emitting module including a color filter transmitting light exhibiting green and a reflective film and a semi-transmissive and semi-reflective film between which the optical path length is adjusted to j/2 times (j is a natural number) the length greater than or equal to 500 nm and less than 600 nm, or a third light-emitting module including a color filter transmitting light exhibiting blue and a reflective film and a semi-transmissive and semi-reflective film between which the optical path length is adjusted to k/2 times (k is a natural number) the length greater than or equal to 400 nm and less than 500 nm.

Further, in any of the display devices according to another embodiment of the present invention, a light-emitting module provided in a pixel is a first light-emitting module including a color filter transmitting light exhibiting red and a reflective film and a semi-transmissive and semi-reflective film between which the optical path length is adjusted to i/2 times (i is a natural number) the length greater than or equal to 600 nm and less than 800 nm, a second light-emitting module including a color filter transmitting light exhibiting green and a reflective film and a semi-transmissive and semi-reflective film between which the optical path length is adjusted to j/2 times (j is a natural number) the length greater than or equal to 500 nm and less than 600 nm, or a third light-emitting module including a color filter transmitting light exhibiting blue and a reflective film and a semi-transmissive and semi-reflective film between which the optical path length is adjusted to k/2 times (k is a natural number) the length greater than or equal to 400 nm and less than 500 nm. The first light-emitting module, the second light-emitting module, and the third light-emitting module share one layer containing a light-emitting organic compound.

In any of the above-described display devices according to another embodiment of the present invention, the light-emitting module includes a light-emitting element in which one of the pair of electrodes also serves as a reflective film and the other also serves as a semi-transmissive and semi-reflective film.

With such a structure, color purity of light emitted from each of the light-emitting module can be increased. Further, the layers containing a light-emitting organic compound can be formed in one step. Further, the pair of electrodes also can serve as the reflective film and the semi-transmissive and semi-reflective film. Therefore, a manufacturing process can be simplified. Thus, it is possible to provide a display device that can be easily manufactured and display an image which causes a viewer less strain associated with viewing and gives a viewer a sense of great depth.

In particular, a microcavity is highly effective in narrowing the spectral line half-width and in making a pixel become more unnoticeable as the resolution becomes higher. Further, it is easy for a human brain to recognize an image in motion and an image which changes from a still image to a moving image. Therefore, by increasing color purity and making a pixel become more unnoticeable, a smoother moving image can be displayed; thus, it is possible to provide a display device that can display an image which causes a viewer less strain associated with viewing and gives a viewer a sense of great depth.

In any of the display devices according to another embodiment of the present invention, a light-emitting module provided in a pixel emits light exhibiting red with a spectral line half-width of less than 50 nm, light exhibiting green with a spectral line half-width of narrower than the spectral line half-width of light exhibiting red, or light exhibiting blue with a spectral line half-width is narrower than the spectral line half-width of light exhibiting green.

In such a structure, the half-width of light exhibiting green, whose luminosity is higher than that of light exhibiting red, is narrower than the half-width of light exhibiting red, and the half-width of light exhibiting blue is narrower than the half-width of light exhibiting green. Thus, an image with high saturation can be displayed with the use of light having a narrow spectral line half-width (specifically 50 nm or less), and a depth effect is enhanced.

One embodiment of the present invention is an electronic device including any of the above display devices.

According to one embodiment of the present invention, an image with a wide distribution of light and shade is displayed on the electronic device. Further, an image which is faithful to camerawork can be displayed smoothly on the electronic device. Therefore, a viewer is given a greater sense of depth by monocular viewing, which can eliminate the need for displaying images including a binocular parallax on one screen. In addition, a viewer can see an image with naked eyes. Thus, it is possible to provide an electronic device for enjoying images which cause a viewer less strain associated with viewing and give a viewer a sense of great depth.

Note that "optical path length" in this specification means the product of distance and refractive index. Therefore, the optical path length of a medium having a refractive index of more than 1 is longer than the actual distance. Note that the optical path length in a resonator of a micro resonator (also referred to as microcavity) can be obtained by measuring optical interference. Specifically, the optical path length in a resonator can be obtained as follows: an intensity ratio of reflected light to incident light is measured with a spectrophotometer and the measured intensity ratio is plotted with respect to a wavelength.

Note that in this specification, the display device includes any of the following modules in its category: a module in which a connector such as a flexible printed circuit (FPC) or a tape carrier package (TCP) is attached to a display panel; a module having a TCP provided with a printed wiring board at the end thereof; and a module having an integrated circuit (IC) directly mounted over a substrate over which a display portion is formed by a chip on glass (COG) method.

According to the present invention, a display device that can display an image which causes a viewer less strain associated with viewing and gives a viewer a sense of great depth can be provided.

BRIEF DESCRIPTION OF DRAWINGS

FIG. 1 is a diagram illustrating a display device according to Embodiment.

BEST MODE FOR CARRYING OUT THE INVENTION

Figure 2A:
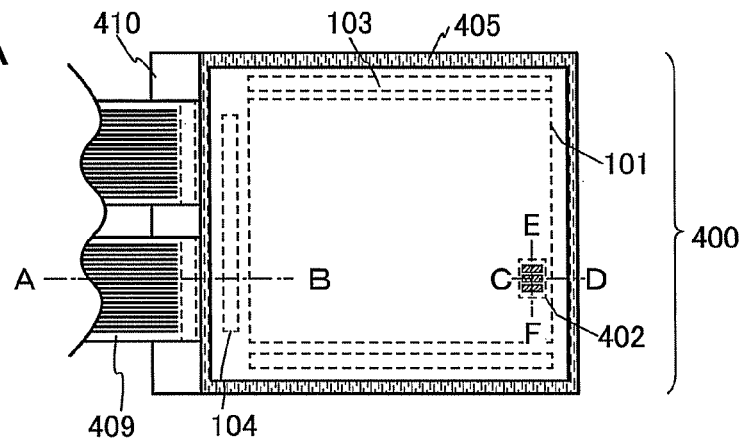
FIGS. 2A to 2C are diagrams illustrating a display portion of a display device according to Embodiment.

Embodiments of the present invention will be described in details with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

Embodiment 1

In this embodiment, a configuration example of a display device of one embodiment of the present invention is described with reference to drawings.

FIG. 1 is a block diagram illustrating a configuration example of a display device according to one embodiment of the present invention.

A display device 100 includes a display portion 101, a driver circuit portion 103, a driver circuit portion 104, a control circuit portion 105, an image processing device 107, and a decoder circuit portion 109.

The decoder circuit portion 109 is inputted with an image signal S0 which is compressed or encoded, decodes the image signal S0, and converts it into a first image signal S1. The first image signal S1 converted here is transmitted to the image processing device 107.

The image processing device 107 converts the inputted first image signal S1 into a second image signal S2 containing image data which is proper to display in the display portion 101.

The image processing device 107 includes at least a grayscale conversion portion 111. The grayscale conversion portion 111 performs grayscale conversion processing to the first image signal S1 having p gray levels, thereby generating the second image signal S2. In the grayscale conversion processing, grayscale conversion processing in which each of q gray levels from the lowest luminance to the q-th value in the first image signal S1 is further divided into $2^r$ value. Here, q is greater than or equal to 1 and less than or equal to p/2 and r is greater than or equal to 1 and less than or equal to 20.

Note that the image processing device 107 is described in detail in an embodiment below.

The second image signal S2 converted in the image processing device 107 is transmitted to the control circuit portion 105.

The control circuit portion 105 transmits a driving signal in accordance with the second image signal S2 to each of the driver circuit portion 103 and the driver circuit portion 104 which drive the display portion 101.

The control circuit portion 105 may include, for example, a DA converter, an amplifier circuit, a register circuit, and the like.

The driver circuit portions 103 and 104 drive pixels in the display portion 101 in accordance with the driving signal inputted from the control circuit portion 105 and display images in the display portion 101.

The display portion 101 can display images which are eye-friendly and give viewers a great sense of depth.

<Structure Example of Display Portion>

A structure example of the display portion 101 is described in detail below.

A display panel 400 exemplified in this embodiment includes the display portion 101 over a first substrate 410. The display portion 101 includes a plurality of pixels 402. The pixel 402 includes a plurality of sub-pixels (e.g., three sub-pixels) (FIG. 2A). Over the first substrate 410, in addition to the display portion 101, a source side driver circuit portion 104 and a gate side driver circuit portion 103 which drive the display portion 101 are provided. Note that the driver circuit portions can be provided not over the first substrate 410 but externally.

The display panel 400 includes an external input terminal and receives a video signal, a clock signal, a start signal, a reset signal, and the like from an FPC (flexible printed circuit) 409. Note that although only an FPC is illustrated here, a printed wiring board (PWB) may be attached thereto. The display panel in this specification includes not only a main body of the display panel but one with an FPC or a PWB attached thereto.

A sealant 405 bonds the first substrate 410 and a second substrate 440. The display portion 101 is sealed in a space 431 formed between the substrates (see FIG. 2B).

<Structure of Display Panel>

Figure 2B:
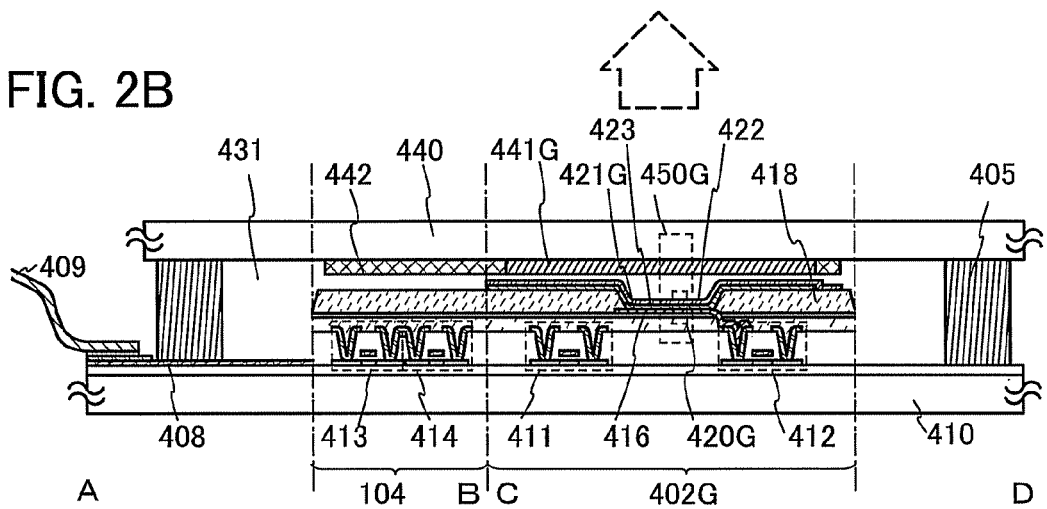

The structure including the cross-sectional view of the display panel 400 is described with reference to FIG. 2B. The display panel 400 includes the source side driver circuit portion 104, a sub-pixel 402G included in the pixel 402, and a lead wiring 408. Note that the display portion 101 of the display panel 400 exemplified in this embodiment emits light in the direction denoted by the arrow in the drawing, thereby displaying images.

A CMOS circuit, which is a combination of an n-channel transistor 413 and a p-channel transistor 414, is formed for the source side driver circuit portion 104. Note that the driver circuit is not limited to this structure and may be various circuits, such as a CMOS circuit, a PMOS circuit, or an NMOS circuit.

The lead wiring 408 transmits a signal inputted from an external input terminal to the source side driver circuit portion 104 and the gate side driver circuit portion 103.

The sub-pixel 402G includes a switching transistor 411, a current control transistor 412, and a light-emitting module 450G. Note that an insulating layer 416 and a partition 418 are formed over the transistor 411 and the like. The light-emitting module 450G includes a reflective film, a semi-transmissive and semi-reflective film, a light-emitting element 420G between the reflective film and the semi-transmissive and semi-reflective film, and a color filter 441G provided on the semi-reflective film side through which light emitted from the light-emitting element 420G is extracted. In the light-emitting module 450G exemplified in this embodiment, a first electrode 421G and a second electrode 422 of the light-emitting element 420G also serve as the reflective film and the semi-transmissive and semi-reflective film, respectively. Note that a direction of an image displayed in the display portion 101 is determined in accordance with a direction in which light emitted from the light-emitting element 420G is extracted.

In addition, a light-blocking film 442 is formed so as to surround the color filter 441G. The light-blocking film 442 prevents a phenomenon in which the display panel 400 reflects outside light and has an effect of increasing the contrast of images displayed in the display portion 101. Note that the color filter 441G and the light-blocking film 442 are formed on the second substrate 440.

The insulating layer 416 is a layer having insulating properties for planarizing a step due to the structure of the transistor 411 and the like or for suppressing impurity dispersion to the transistor 411 and the like. The insulating layer 416 can be a single layer or a stacked layer. The partition 418 is an insulating layer having an opening; the light-emitting element 420G is formed in the opening of the partition 418.

The light-emitting element 420G includes the first electrode 421G, the second electrode 422, and a layer 423 containing a light-emitting organic compound.

[Structure of Transistor]

Top-gate transistors are used in the display panel 400 exemplified in FIG. 2A. Various types of transistors can be used for the source side driver circuit portion 104, the gate side driver circuit portion 103, and the sup-pixels. Note that various semiconductors can be used for a region where channels of these transistors are formed. Specifically, amorphous silicon, polysilicon, single crystal silicon, an oxide semiconductor, or the like can be used.

When an oxide semiconductor is used for a region where a channel of a transistor is formed, the transistor can be smaller than a transistor in which an amorphous silicon is used, which results in higher resolution pixels in a display portion.

An oxide semiconductor film which can be used for a semiconductor layer of a transistor may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

In the case where a CAAC-OS film is deposited by a sputtering method, a substrate temperature in the deposition is preferably high. For example, an oxide film is deposited at a substrate heating temperature from 100° C. to 600° C., preferably from 200° C. to 500° C., further preferably from 150° C. to 450° C., whereby a CAAC-OS film can be deposited.

Electric power used in a sputtering method is preferably supplied from a direct-current (DC) source. Note that a radio frequency (RF) power source or an alternating-current (AC) power source can be used. Note that it is difficult to use an RF power source for a sputtering apparatus which is capable of deposition to a large-sized substrate. In addition, a DC power source is preferred to an AC power source from the viewpoint below.

In the case where an In—Ga—Zn—O compound target is used as a sputtering target, an In—Ga—Zn—O compound target in which $InO_x$ powder, $GaO_y$ powder, and $ZnO_z$ powder are mixed in the molar ratio of 2:2:1, 8:4:3, 3:1:1, 1:1:1, 4:2:3, 3:1:2, or 3:1:4 is preferably used, for example. x, y, and z are any positive numbers. Note that a sputtering target may be polycrystalline.

Alternatively, with use of magnetron, plasma area near a sputtering target can be increased in density due to a magnetic field. For example, in a magnetron sputtering apparatus, a magnetic assembly is located in the back of the sputtering target and a magnetic field is generated in the front of the sputtering target. When sputtering to the sputtering target, the magnetic field traps ionized electrons and secondary electrons generated by the sputtering. The electrons trapped in this way enhance the odds of collision with an inert gas, such as a rare gas, in the deposition chamber, thereby increasing the plasma density. Thus, the deposition rate can be increased without significantly increasing the temperature of an element formation layer.

In the case where a CAAC-OS film is deposited by a sputtering method, for example, impurities (e.g., hydrogen, water, carbon dioxide, and nitrogen) existing in a deposition chamber of a sputtering apparatus is preferably reduced. Further, the concentration of impurities in a deposition gas is preferably reduced. For example, as a deposition gas such as an oxygen gas or an argon gas, a highly purified gas having a dew point of −40° C. or lower, preferably −80° C. or lower, still preferably −100° C. or lower is used, whereby suppressing entry of impurities into a CAAC-OS film.

In the case where a CAAC-OS film is deposited by a sputtering method, it is preferable to suppress plasma damage when the deposition is performed by increasing the oxygen percentage in the deposition gas and optimizing electric power. For example, the oxygen percentage in the deposition gas is preferably 30 vol % or higher, still preferably 100 vol %.

In the case where a CAAC-OS film is deposited by a sputtering method, heat treatment may be performed in addition to the substrate heating when the deposition is performed. By the heat treatment, the impurity concentration in the oxide semiconductor film can be reduced, for example.

The heat treatment is performed at higher than or equal to 350° C. and lower than a strain point of the substrate, or may be performed at higher than or equal to 350° C. and lower than or equal to 450° C. Note that the heat treatment may be performed more than once.

There is no particular limitation on a heat treatment apparatus to be used for the heat treatment, and a rapid thermal annealing (RTA) apparatus such as a gas rapid thermal annealing (GRTA) apparatus or a lamp rapid thermal annealing (LRTA) apparatus may be used. Alternatively, another heat treatment apparatus such as an electric furnace may be used.

As described in the above process, an impurity concentration in the oxide semiconductor film is reduced by preventing entry of hydrogen, water, or the like into the film during the deposition. The impurity concentration can be reduced by removing hydrogen, water, or the like contained in the oxide semiconductor film through the heat treatment after the deposition of the oxide semiconductor film. After that, oxygen is supplied to the oxide semiconductor film to repair oxygen defects, thereby highly purifying the oxide semiconductor film. Moreover, oxygen may be added to the oxide semiconductor film. The purified oxide semiconductor is an i-type (intrinsic) semiconductor or a substantially i-type semiconductor. The carrier density of the oxide semiconductor film which is substantially i-type is lower than $1 \times 10^{17}/cm^3$, lower than $1 \times 10^{15}/cm^3$, or lower than $1 \times 10^{13}/cm^3$.

When a single crystal semiconductor is used for a region where a channel of a transistor is formed, the size of the transistor can be reduced, which results in higher resolution pixels in a display portion.

As a single crystal semiconductor used for forming a semiconductor layer, a semiconductor substrate, typical examples of which include a single crystal semiconductor substrate formed using elements belonging to Group 14, such as a single crystal silicon substrate, a single crystal germanium substrate, or a single crystal silicon germanium substrate, and a compound semiconductor substrate (e.g., a SiC substrate, a sapphire substrate, and a GaN substrate), can be used. Preferred one is a silicon on insulator (SOI) substrate in which a single crystal semiconductor layer is provided on an insulating surface.

An SOI substrate can be fabricated by the following methods: after oxygen ions are implanted in a mirror-polished wafer, the wafer is heated at high temperatures to form an oxidized layer at a predetermined depth from a surface of the wafer and eliminate defects generated in a surface layer; the semiconductor substrate is separated by utilizing the growth of microvoids formed by hydrogen ion irradiation (this growth is caused by heat treatment); or a single crystal semiconductor layer is formed on an insulating surface by crystal growth.

In this embodiment, ions are added through one surface of a single crystal semiconductor substrate, an embrittlement layer is formed at a certain depth from the one surface of the single crystal semiconductor substrate, and an insulating layer is formed over the one surface of the single crystal semiconductor substrate or over the first substrate 410. Next, heat treatment is performed in the state in which the single crystal semiconductor substrate provided with the embrittlement layer and the first substrate 410 are bonded to each other with the insulating layer interposed therebetween, so that a crack is generated in the embrittlement layer to separate the single crystal semiconductor substrate along the embrittlement layer. Thus, a single crystal semiconductor layer, which is separated from the single crystal semiconductor substrate, is formed as a semiconductor layer over the first substrate 410. Note that a glass substrate can be used as the first substrate 410.

Further, regions electrically insulated from each other may be formed in the semiconductor substrate so that transistors 411 and 412 may be formed using the regions electrically insulated from each other.

When a channel formation region is formed using a single crystal semiconductor, variations in electrical characteristics, such as threshold voltage, between transistors due to bonding defects at grain boundaries can be reduced. Thus, in the display panel according to one embodiment of the present invention, the light-emitting elements can be operated normally without placing a circuit for compensating threshold voltage in each pixel. The number of circuit elements per pixel can therefore be reduced, increasing the flexibility in layout. Thus, a high-definition display panel can be achieved. For example, a structure in which a matrix of a plurality of pixels is included, specifically 300 or more pixels per inch (i.e., the horizontal resolution is 300 or more pixels per inch (ppi)), preferably 400 or more pixels per inch (i.e., the horizontal resolution is 400 ppi or more), can be achieved.

Moreover, a transistor whose channel formation region is composed of a single crystal semiconductor can be downsized while keeping high current drive capability. The use of the downsized transistor leads to a reduction in the area of a circuit portion that does not contribute to display, which results in an increase in the display area in the display portion and a reduction in the frame size of the display panel.

[Structure of Pixel]

Figure 2C:
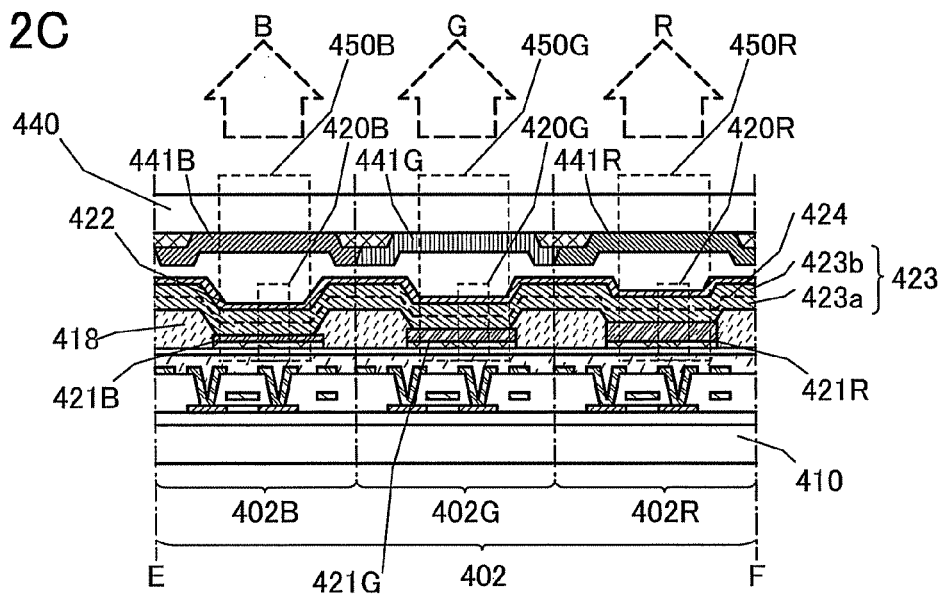

The structure of the pixel 402 included in the display portion 101 is described with reference to FIG. 2C.

The pixel 402 exemplified in this embodiment includes the sub-pixel 402G. The sub-pixel 402G includes the light-emitting element 420G; the light-emitting element 420G includes the first electrode 421G also serving as a reflective film, the second electrode 422 also serving as a semi-transmissive and semi-reflective film, a layer 423a containing a light-emitting organic compound, a layer 423b containing a light-emitting organic compound, and an interlayer 424. Further, the pixel 402 includes the color filter 441G on the second electrode 422 side so as to overlap with the light-emitting element 420G, and the light-emitting module 450G capable of emitting light with a spectrum whose half-width is 60 nm or less and wavelength of 400 nm or higher and lower than 800 nm within a response time of less than or equal to 100 µs.

Such a pixel is provided in the display portion 101 at a resolution of 80 ppi or higher, preferably 300 ppi or higher; thus, a display device with an NTSC ratio of 80% or higher, preferably 95% or higher, and a contrast ratio of 500 or higher, preferably 2000 or higher is provided. Consequently, it is possible to provide a display device that can display images which cause a viewer less strain associated with viewing and give a viewer a sense of great depth. In addition, light interferes with each other between the reflective film and the semi-transmissive and semi-reflective film, a specific light among light with a wavelength of 400 nm or higher and lower than 800 nm is strengthened, and unnecessary light are absorbed by the color filter. Accordingly, high color saturation images can be displayed by light with a narrow spectral line width (specifically, 60 nm or less), thereby giving a viewer a greater sense of depth.

In addition, the pixel 402 includes a sub-pixel 402B emitting light B exhibiting blue, a sub-pixel 402G emitting light G exhibiting green, and a sub-pixel 402R emitting light R exhibiting red. Each sub-pixel includes a driver transistor and a light-emitting module. Each light-emitting module includes a reflective film, a semi-transmissive and semi-reflective film, and a light-emitting element between the reflective film and the semi-transmissive and semi-reflective film.

When a microresonator is formed between the reflective film and the semi-transmissive and semi-reflective film and a light-emitting element is formed therebetween, light with a specific wavelength can be efficiently extracted through the semi-transmissive and semi-reflective film. Specifically, the optical path length of the microresonator is n/2 times (n is a natural number) the wavelength of extracted light; thus, light extraction efficiency can be enhanced. The wavelength of extracted light depends on the distance between the reflective film and the semi-transmissive and semi-reflective film, and the distance can be adjusted by forming an optical adjustment layer between the films.

A conductive film having light-transmitting properties to visible light or a layer containing a light-emitting organic compound can be employed for a material that can be used for the optical adjustment layer. For example, the thickness of the optical adjustment layer may be adjusted using a charge generation region. Alternatively, a region containing a substance having a high hole-transport property and an acceptor substance is preferably used for the optical adjustment layer because an increase in driving voltage can be suppressed even when the optical adjustment layer is thick.

As the structure of the light-emitting element, the light-emitting element 420G is provided between the first electrode 421G also serving as a reflective film and the second electrode 422 also serving as a semi-transmissive and semi-reflective film. The light-emitting element 420G includes the layer 423a containing a light-emitting organic compound, the layer 423b containing a light-emitting organic compound, and the interlayer 424.

Note that the structure example of the light-emitting element is described in detail in Embodiment 3.

Here, in the case of a display device using a liquid-crystal element in a pixel, the response time can not be increased enough because pixels are driven by physically changing the orientation of liquid crystals. In contrast, the response time of the above-described light-emitting element is shorter than a liquid-crystal element. Thus, a display device using such a light-emitting element can display smooth moving images, in which after-images do not likely appear when displaying moving images. As a result, a display device capable of displaying more vivid and stereoscopic images and giving viewers a rich sense of depth can be obtained.

The light-emitting modules exemplified in this embodiment each have a structure in which the second electrode 422 provided in the light-emitting module also serves as a semi-transmissive and semi-reflective film. Specifically, the second electrode 422 shared by the light-emitting elements 420B, 420G, and 420R also serves as a semi-transmissive and semi-reflective film of the light-emitting modules 450B, 450G, and 450R.

In addition, the first electrodes of the light-emitting elements each of which is provided in the light-emitting modules and are electrically separated from each other also serve as reflective films. Specifically, a first electrode 421B provided in the light-emitting element 420B also serves as a reflective film of the light-emitting module 450B, the first electrode 421G provided in the light-emitting element 420G also serves as a reflective film of the light-emitting module 450G, and a first electrode 421R provided in the light-emitting element 420R also serves as a reflective film of the light-emitting module 450R.

The first electrode also serving as a reflective film of a light-emitting module has a stacked-layer structure in which an optical adjustment layer is stacked over the reflective film. The optical adjustment layer is preferably formed of a conductive film having light-transmitting properties with respect to visible light, and the reflective film is preferably formed of a conductive metal film having high reflectivity with respect to visible light.

The thickness of the optical adjustment layer is adjusted in accordance with a wavelength of light extracted from a light-emitting module.

For example, the first light-emitting module 450B includes a color filter 441B which transmits light exhibiting blue, the first electrode 421B also serving as a reflective film, and the second electrode 422 also serving as a semi-transmissive and semi-reflective film; the optical path length between the first electrode 421B and the second electrode 422 is adjusted to k/2 times (k is a natural number) the length greater than or equal to 400 nm and less than 500 nm.

Further, the second light-emitting module 450G includes a color filter 441G which transmits light exhibiting green, a reflective film, and a semi-transmissive and semi-reflective film; the optical path length between the reflective film and the semi-transmissive and semi-reflective film is adjusted to j/2 times (j is a natural number) the length greater than or equal to 500 nm and less than 600 nm.

Further, the third light-emitting module 450R includes a color filter 441R which transmits light exhibiting red, a reflective film, and a semi-transmissive and semi-reflective film; the optical path length between the reflective film and the semi-transmissive and semi-reflective film is adjusted to i/2 times (i is a natural number) the length greater than or equal to 600 nm and less than 800 nm.

In such a light-emitting module, light emitted from the light-emitting elements interfere with each other between the reflective film and the semi-transmissive and semi-reflective film, light having a specific wavelength among light having a wavelength of greater than or equal to 400 nm and less than 800 nm is strengthened, and the color filter absorbs unnecessary light. Accordingly, high color saturation images can be displayed by light with a narrow spectral line width (specifically, 60 nm or less), thereby giving a viewer a greater sense of depth. Consequently, it is possible to provide a display device that can display images which cause a viewer less strain associated with viewing and give a viewer a sense of great depth.

In particular, the third light-emitting module 450R emits light exhibiting red with a spectral line half-width of less than 50 nm, the second light-emitting module 450G emits light exhibiting green with a spectral line half-width of smaller than that of the light emitted from the third light-emitting module 450R, and the first light-emitting module 450B emits light exhibiting blue with a spectral line half-width of smaller than that of the light emitted from the second light-emitting module 450G.

In the light-emitting module with such a structure, a half-width of high-luminosity green light is narrower than that of red light and a half-width of blue light is narrower than that of green light. Accordingly, high color saturation images can be displayed by light with a narrow spectral line width (specifically, 50 nm or less), thereby giving a viewer a greater sense of depth.

Note that the first light-emitting module 450B, the second light-emitting module 450G, and the third light-emitting module 450R each include the layer 423a containing a light-emitting organic compound, the layer 423b containing a light-emitting organic compound, and the interlayer 424. In addition, one of the pair of electrodes of the light-emitting element also serves as a reflective film and the other thereof also serves as a semi-transmissive and semi-reflective film.

In the light-emitting modules with such a structure, each layer containing light-emitting organic compound in the plurality of light-emitting modules can be formed in one process. In addition, a pair of electrodes also serves as a reflective film and a semi-transmissive and semi-reflective film. Therefore, a manufacturing process can be simplified. Thus, it is possible to provide a display device that can be easily manufactured and display an image which causes a viewer less strain associated with viewing and gives a viewer a sense of great depth.

In addition, the pixel includes light-emitting modules each emitting light with a narrow spectral line half-width and high color purity, which increases NTSC ratio and contrast. Thus, an image with a wide grayscale range can be displayed. Further, a response time of the light-emitting element in the pixel is short; thus, smooth moving images can be displayed. Thus, a moving image in which a front image moves smoothly and faster than a back image while overlapping with the back image can be expressed. The wide grayscale range and the smooth motion interact with each other, which allows a viewer to see an image with a strong sense of depth.

In particular, a microcavity is highly effective in narrowing the spectral line half-width and in making a pixel become more unnoticeable as the resolution becomes higher. Further, it is easy for a human brain to recognize an image in motion and an image which changes from a still image to a moving image. Therefore, by increasing color purity and making a pixel become more unnoticeable, a smoother moving image can be displayed; thus, it is possible to provide a display device that can display an image which causes a viewer less strain associated with viewing and gives a viewer a sense of great depth.

[Structure of Partition]

The partition 418 is formed to cover end portions of the first electrodes 421B, 421G, and 421R.

The partition 418 has a curved surface with curvature at a lower end portion thereof. As a material of the partition 418, negative or positive photosensitive resin can be used.

Note that using a material absorbing visible light for the partition produces an effect of suppressing light leakage into adjacent light-emitting elements (also called cross talk).

In addition, in such a structure that images are displayed by extracting light emitted from the light-emitting module from the first substrate 410 side which is provided with a semi-transmissive and semi-reflective film, the partition formed using a material absorbing visible light absorbs outside light which is reflected by the reflective film on the first substrate 410, thereby suppressing the reflection.

[Sealing Structure]

The display panel 400 exemplified in this embodiment has a structure in which the light-emitting element is sealed in a space enclosed by the first substrate 410, the second substrate 440, and the sealant 405.

The space can be filled with an inert gas (e.g., nitrogen or argon) or resin. An absorbent of impurity (typically, water and/or oxygen) such as a dry agent may be provided.

The sealant 405 and the second substrate 440 are desirably formed using a material which does not transmit impurities in the air (such as water and/or oxygen) as much as possible. An epoxy-based resin, glass frit, or the like can be used for the sealant 405.

Examples of the second substrate 440 include a glass substrate; a quartz substrate; a plastic substrate formed of polyvinyl fluoride (PVF), polyester, an acrylic resin, or the like; a substrate of fiberglass-reinforced plastics (FRP); and the like.

The above is the description of the display panel 400 including the display portion 101.

<Structural Example of Image Processing Device>

The following describes details on the image processing device 107 exemplified in FIG. 1, with reference to drawings.

Figure 3:
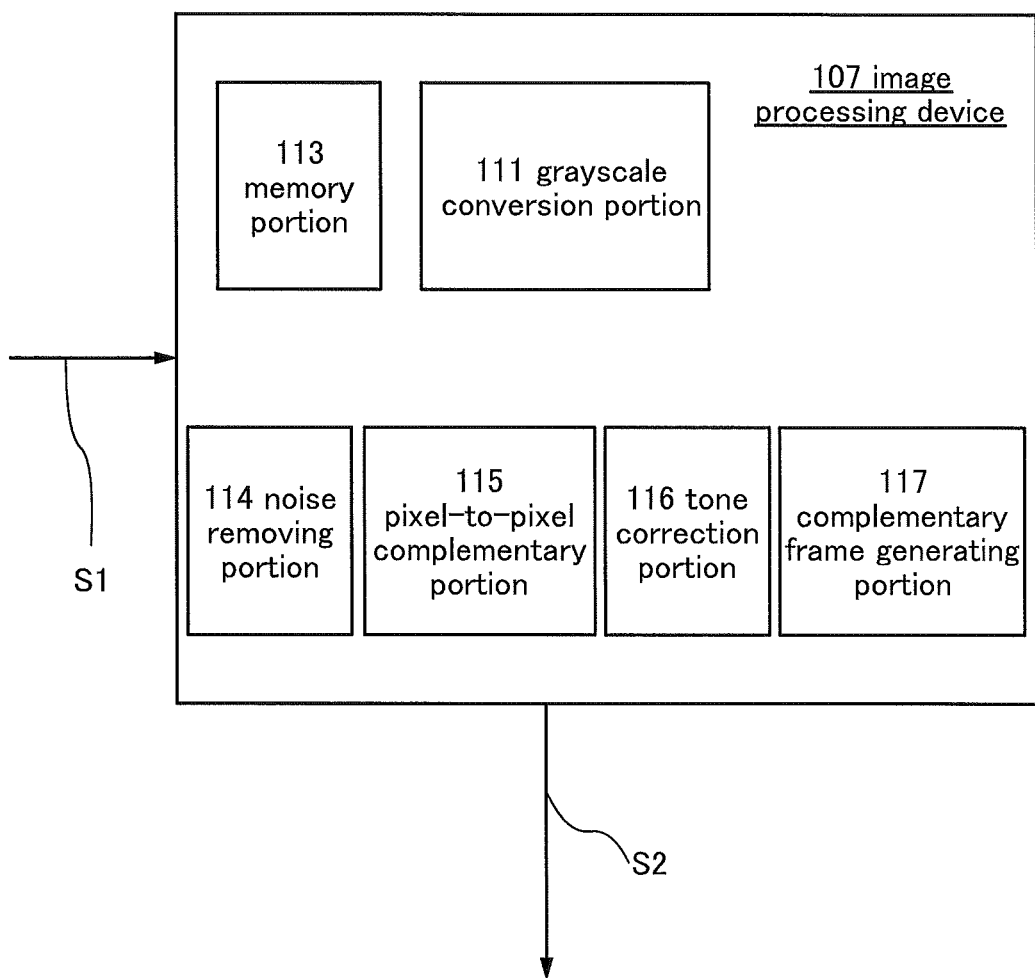
FIG. 3 is a diagram illustrating an image processing device according to Embodiment.

FIG. 3 is a block diagram of the image processing device 107. The image processing device 107 included in the display device 100 has at least the grayscale conversion portion 111.

As shown in FIG. 3, the image processing device 107 may include a memory portion 113, a noise removing portion 114, a pixel-to-pixel complementary portion 115, a tone correction portion 116, a complementary frame generating portion 117, and the like.

The grayscale conversion portion 111 performs the above-described grayscale conversion processing on the first image signal S1. A specific example of the grayscale conversion processing is described later.

The memory portion 113 is configured to temporarily store an initial image data contained in the inputted first image signal S1 and image data subjected to conversion processing in each portion. As the memory portion 113, a memory device such as a dynamic random access memory (DRAM), a static random access memory (SRAM), or a register circuit can be used.

The noise removing portion 114 removes various noise, such as mosquito noise which appears near outline of texts and the like, block noise which appears in high-speed moving images, random noise causing flicker, and dot noise caused by up-conversion of resolution.

The pixel-to-pixel complementary portion 115 complements data which does not actually exists when resolution is up-converted. For example, referring pixels around the target pixel, data is complemented to display intermediate color between the pixels.

The tone correction portion 116 can correct color tone of images. For example, the tone correction portion 116 detects a type, luminance, color purity, and the like of a lighting in a space where the display device is provided, and corrects tone of images displayed in the display portion 101 to optimal tone in accordance with the detection. The tone correction portion 116 can have a function of referring a displayed image to various images of various scenes in an image list stored in advance, and then correcting tone of the displayed image to tone suitable to the images in the closest scene of the image.

The complementary frame generating portion 117 generates an image of an insufficient frame due to increased frame frequency of displayed images. For example, the complementary frame generating portion 117 generates an image of a frame between two images from the difference between the two images, or can generate a plurality of images between two images. For example, when frame frequency of the first image signal S1 is 60 Hz, a plurality of complementary frames are generated and frame frequency of the second image signal S2 can be increased twofold (120 Hz), fourfold (240 Hz), eightfold (480 Hz), or the like.

In this manner, by adding various functions to the image processing device 107 other than grayscale conversion processing by the grayscale conversion portion 111, the image processing device 107 can generates the second image signal S2 containing a more vivid image.

<Grayscale Conversion Processing>

The following is a description on grayscale conversion processing by the grayscale conversion portion 111. Here, the description is made assuming that the first image signal S1 is inputted to the grayscale conversion portion 111 and the second image signal S2 is outputted as a signal subjected to grayscale conversion processing by the grayscale conversion portion 111.

Figure 4A:
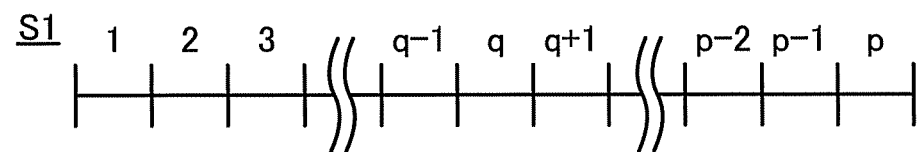
FIGS. 4A to 4C are diagrams illustrating grayscale conversion processing according to Embodiment.
Figure 4B:
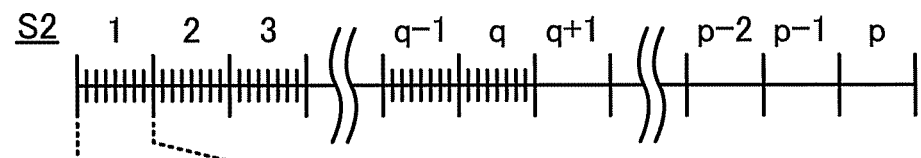
Figure 4C:
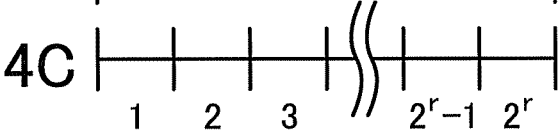

FIG. 4A schematically shows grayscale data contained in the first image signal S1 inputted to the grayscale conversion portion 111. FIG. 4B schematically shows grayscale data contained in the second image signal S2 subjected to grayscale conversion processing. FIG. 4C shows grayscale data in which the gray level in FIG. 4B is enlarged.

The first image signal S1 has p gray levels. For example, in the case where the first image signal S1 is an 8-bit signal, the first image signal S1 has 256 gray levels. Here, when a gray level is 1, display is performed with the lowest luminance in the dynamic range of luminance which can be displayed by the display device 100. On the other hand, when a gray level is p, display is performed with the highest luminance.

The gray levels of the first image signal S1 are divided at equal spaces from 1 to p. Thus, when the first image signal S1 is directly inputted to the display device 100, an image is displayed by a linear grayscale expression from the lowest luminance to the highest luminance.

As shown in FIG. 4B, grayscale conversion processing further divides one gray level in the low luminance side. Specifically, each of q gray levels from 1 to q is divided into some levels. Here, q is from 1 to ¼p, preferably from 1 to ½p. The grayscale conversion processing is performed in a wider range; thus, images can give a viewer a greater sense of depth.

In addition, when one gray level is divided into some levels, the division number is preferably factorial of 2 as shown in FIG. 4C. That is, one gray level is divided into $2^r$-value. Here, r is a natural number from 1 to 8, preferably from 1 to 20. As the division number of one gray level is increased, an image given a greater sense of depth can be generated.

For example, when the first image signal S1 represents 8-bit gray levels, q is ¼, and r is 8, each 64 values in the low luminance side of the first image signal S1 is divided into 256 values. In this case, the number of the gray levels of the second image signal S2 becomes 16512 gray levels.

Here, when an organic EL element is preferably used as a light-emitting element included in the display portion 101, more precise grayscale expression can be obtained in the low luminance region. Furthermore, much more precise grayscale expression can be obtained when a light-emitting module in which a microresonator (also referred to as a microcavity) structure and a color filter are combined is used as a light-emitting module to obtain light emission with increased color purity from each pixel. For example, grayscale can be expressed by 1000000 gray levels or more in a luminance region lower than half of the maximum luminance.

Next, new gray levels obtained by dividing one gray level are assigned to each pixel. For example, referring to the gray levels assigned to pixels around a target pixel by the first image signal, an intermediate gray level between the gray levels is given. Alternatively, referring to the gray levels of a target pixel in a plurality of images of around a target frame or to the gray level of pixels around the target pixel, an intermediate gray level between the gray levels can be given.

By the above grayscale conversion processing, the grayscale conversion portion 111 can generate the second image signal S2 containing an image given a greater sense of depth from the inputted first image signal S1.

Here, images before and after grayscale conversion processing is performed are exemplified in FIGS. 5A to 5D.

Figure 5A:
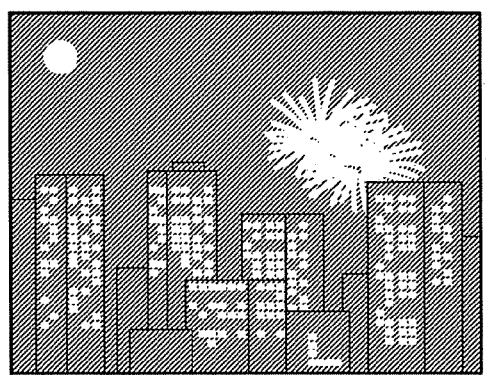
FIGS. 5A to 5D are diagrams illustrating grayscale conversion processing according to Embodiment.
Figure 5B:
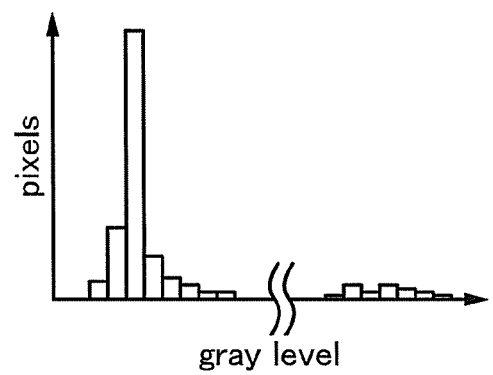

FIG. 5A is an example of an image before grayscale conversion processing is performed; the night view of skyscrapers and fireworks sent up in the back side of the skyscrapers. FIG. 5B is a histogram (also referred to as luminance distribution) of the number of pixels with respect to the gray levels of the image of FIG. 5A. Note that in the histogram of FIG. 5B, the low luminance side and the high luminance side are partly shown.

In FIG. 5A, the gray level of skyscrapers located in front of the fireworks is close to the gray level of the background; thus, there are many regions displayed by similar gray level as shown in FIG. 5B. As a result, the positional relation (front-and-back position) between the background and the skyscrapers become blurry and the image is thus very flat.

Figure 5C:
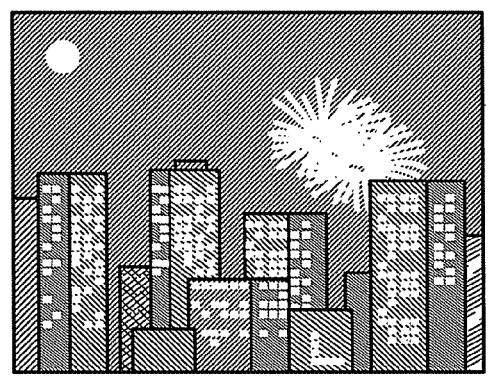
Figure 5D:
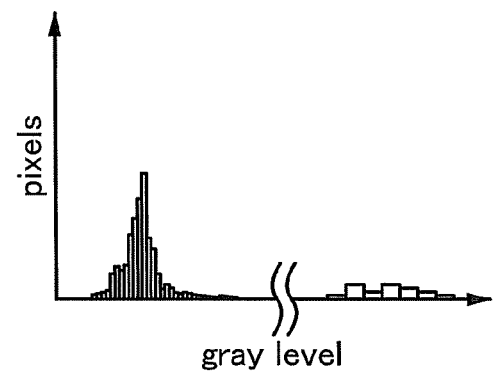

FIG. 5C is an example of the image of FIG. 5A after grayscale conversion processing is performed. FIG. 5D is a histogram of the number of pixels with respect to the gray levels of the image of FIG. 5C.

As shown in FIG. 5D, the number of gray levels in the low luminance region is increased by grayscale conversion processing; thus, the region expressed by similar gray levels in FIG. 5B can be expressed more precisely. As a result, in the image of FIG. 5C, the positional relations (front-and-back position) between the background and the skyscrapers and between the skyscrapers are clearly expressed and the image gives viewers a greater sense of depth on the whole.

The above is the description of grayscale conversion processing.

The display device 100 of one embodiment of the present invention can display images in the display portion 101 which are capable of giving viewers a greater sense of depth. Further, the image processing device 107 including the grayscale conversion portion 111 configured to perform the grayscale conversion processing is provided in the display device 100; thus, the display device 100 can display images which are given a greater sense of depth.

This embodiment can be combined with any of the other embodiments disclosed in this specification as appropriate.

Embodiment 2

In this embodiment, a method in which an image contained in an inputted image signal is divided into a plurality of regions and grayscale conversion processing is performed only to the region which needs the processing is described.

An image contained in the first image signal S1 inputted to the grayscale conversion portion 111 is divided into a plurality of regions, and each luminance distribution in the regions is extracted. In addition, the grayscale conversion portion 111 determines whether to perform grayscale conversion processing to the regions based on the extracted luminance distribution.

The grayscale conversion portion 111 performs the above-described grayscale conversion processing to a region which is determined to be subjected to grayscale conversion processing, whereas grayscale in a region where grayscale conversion processing is not performed remains unchanged.

Then, the grayscale conversion portion 111 integrates the regions where grayscale conversion processing is performed and not performed into one image, thereby generating the second image signal S2, and outputs the second image signal S2.

In this manner, grayscale conversion processing is performed not to all the regions of the image contained in the first image signal S1 but to the region which needs the processing; thus, the processing rate can be increased.

A more specific example is described below with reference to drawings.

Figure 6A:
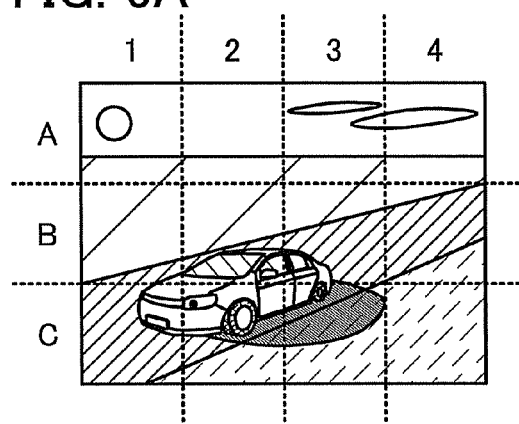
FIGS. 6A to 6D are diagrams illustrating grayscale conversion processing according to Embodiment.

FIG. 6A shows an example of an image contained in the first image signal S1 inputted to the grayscale conversion portion 111. In the image shown in FIG. 6A, a high gray level (high luminance) region and a low gray level (low luminance) region exist together.

Here, an example in which one image is divided into 12 regions (3 high×4 wide) is described as in FIG. 6A. Addresses in a vertical direction are denoted by A, B, and C from the top of the drawing. Addresses in a horizontal direction are denoted by 1, 2, 3, and 4 from the left of the drawing. One region is denoted by, for example, a region [A-1], using these addresses.

Figure 6B:
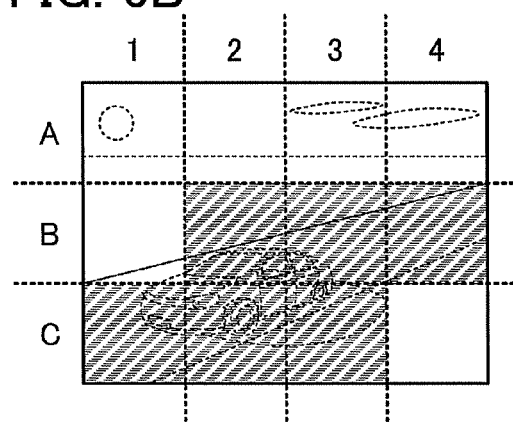
Figure 6C:
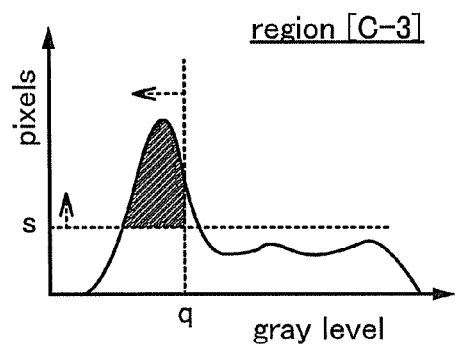

FIG. 6C is a histogram of a region [C-3] in FIG. 6A. The region [C-3] contains many display regions where gray levels are low.

Figure 6D:
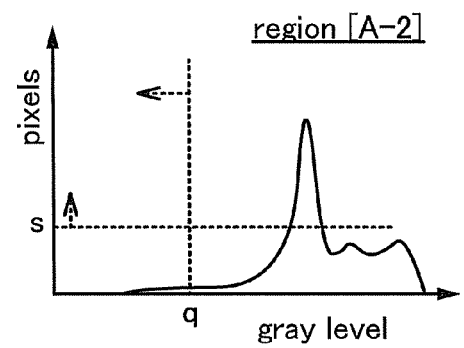

FIG. 6D is a histogram of a region [A-2] in FIG. 6A. The region [A-2] contains few display regions where gray level is low.

With use of such a histogram extracted from each region in this manner, whether to perform grayscale conversion processing to a target region is determined.

One example of a method for determining is described. In the case where a gray level which exceeds the predetermined number of pixels s exists in the range of gray levels from 1 to q in one target region, grayscale conversion processing is performed in this region. On the other hand, when such a gray level does not exist in a target region, grayscale conversion processing is not performed in the region.

The number of pixels s which serves as an index of determining whether to perform grayscale conversion processing is set as appropriate in accordance with the number of gray levels of the first image signal S1 or the number of pixels included in one region.

In the histogram shown in FIG. 6C, gray levels exceeding the predetermined number of pixels s exist in the range of gray levels from 1 to q. Thus, grayscale conversion processing is performed to the region [C-3].

On the other hand, in the histogram shown in FIG. 6D, gray levels exceeding the predetermined number of pixels s do not exist in the range of gray levels from 1 to q. Thus, grayscale conversion processing is not performed to the region [A-2].

The results of determining whether to perform grayscale conversion processing to each region by the above method are shown in FIG. 6B. Among the regions in FIG. 6B, grayscale conversion processing is performed only in hatched regions (region [B-2], region [B-3], region [B-4], region [C-1], region [C-2], and region [C-3]).

Here, there is no limitation on a method for determining whether to perform grayscale conversion processing. For example, whether to perform grayscale conversion processing is determined in each region based on whether or not the total number of pixels contained in the range of gray levels from 1 to q exceeds the predetermined number of pixels.

In such a method, the predetermined number of pixels which serves as an index of determination can be set based on the number of pixels included in one region, without depending on the number of gray levels contained in the first image signal S1; thus, the first image signal S1 containing different number of gray levels can be easily used.

Although one image is divided into 12 regions in the above-described example, there is no limitation on the division number. When the division number is increased and one image is divided into many regions, a regions which needs grayscale conversion processing can be determined in more detail, thereby further increasing processing rate.

By the method exemplified in this embodiment, grayscale conversion processing can be performed only in a region which needs the processing, whereby the processing rate of the grayscale conversion portion 111 can be increased.

This embodiment can be combined with any of the other embodiments in this specification as appropriate.

Embodiment 3

In this embodiment, the structure of a light-emitting element which can be used for the light-emitting module according to an embodiment of the present invention is described with reference to FIGS. 7A to 7C.

The light-emitting element described in this embodiment as an example includes a first electrode, a second electrode, and a layer containing a light-emitting organic compound (hereinafter referred to as an EL layer) provided between the first electrode and the second electrode. One of the first electrode and the second electrode functions as an anode, and the other functions as a cathode. The EL layer is provided between the first electrode and the second electrode, and a structure of the EL layer may be appropriately selected in accordance with materials of the first electrode and second electrode.

<Structural Example of Light-Emitting Element>

Figure 7A:
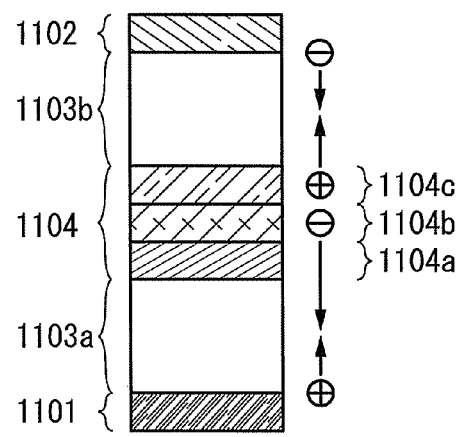
FIGS. 7A to 7C are diagrams illustrating a light-emitting element that can be applied to a display device according to Embodiment.

An example of the structure of the light-emitting element is illustrated in FIG. 7A. The light-emitting element exemplified in FIG. 7A includes an EL layer formed of a first light-emitting unit 1103a and a second light-emitting unit 1103b between an anode 1101 and a cathode 1102. Further, an interlayer 1104 is provided between the first light-emitting unit 1103a and the second light-emitting unit 1103b.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

Note that in this specification, a layer or a stacked body which includes one region where electrons and holes injected from both ends are recombined is referred to as a light-emitting unit.

Note that the number of the light-emitting units provided between the anode 1101 and the cathode 1102 is not limited to two. A light-emitting element exemplified in FIG. 7C has a structure in which a plurality of light-emitting units 1103 is stacked, that is, a so-called tandem structure. Note that in the case where n (n is a natural number greater than or equal to 2) light-emitting units 1103 are provided between the anode and the cathode, the interlayer 1104 is provided between an m-th (m is a natural number greater than or equal to 1 and less than or equal to n−1) light-emitting unit and an (m+1)-th light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

Figure 7B:
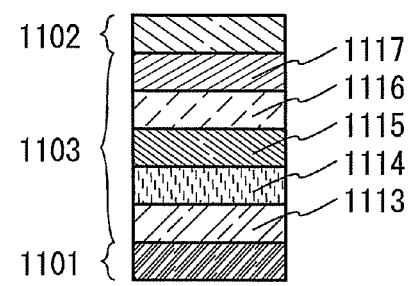
Figure 7C:
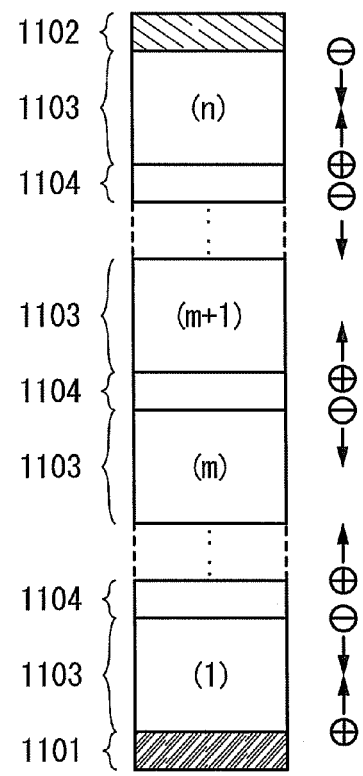

An example of a specific structure of the light-emitting unit 1103 is illustrated in FIG. 7B. In the light-emitting unit 1103 illustrated in FIG. 7B, a hole-injection layer 1113, a hole-transport layer 1114, a light-emitting layer 1115, an electron-transport layer 1116, and an electron-injection layer 1117 are stacked in this order from the anode 1101 side.

An example of a specific structure of the interlayer 1104 is illustrated in FIG. 7A. The interlayer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer layer 1104a are stacked in this order from the cathode 1102 side.

The behaviors of electrons and holes in the interlayer 1104 are described. When a voltage higher than the threshold voltage of the light-emitting element is applied between the anode 1101 and the cathode 1102, in the first charge generation region 1104c, holes and electrons are produced, and the holes move into the light-emitting unit 1103b on the cathode 1102 side and the electrons move into the electron-relay layer 1104b.

The electron-relay layer 1104b has a high electron-transport property and immediately transfers the electrons generated in the first charge generation region 1104c to the electron-injection buffer layer 1104a. The electron-injection buffer layer 1104a can reduce a barrier against electron injection into the light-emitting unit 1103, so that the efficiency of the electron injection into the light-emitting unit 1103 can be improved. Thus, the electrons generated in the first charge generation region 1104c are injected into the LUMO level of the light-emitting unit 1103 through the electron-relay layer 1104b and the electron-injection buffer layer 1104a.

In addition, the electron-relay layer 1104b can prevent interaction in which the substance included in the first charge generation region 1104c and the substance included in the electron-injection buffer layer 1104a react with each other at the interface thereof and the functions of the first charge generation region 1104c and the electron-injection buffer layer 1104a are damaged.

The holes injected into the light-emitting unit 1103b provided on the cathode side are recombined with the electrons injected from the cathode 1102, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the interlayer 1104 cause light emission in the respective light-emitting units.

Note that the light-emitting units can be provided in contact with each other when these light-emitting units allow the same structure as the interlayer to be formed therebetween. Specifically, when one surface of the light-emitting unit is provided with a charge generation region, the charge generation region functions as a first charge generation region of the interlayer; thus, the light-emitting units can be provided in contact with each other.

Note that an interlayer can be provided between the cathode and the n-th light-emitting unit.

<Material for Light-Emitting Element>

Next, specific materials that can be used for the light-emitting element having the above-described structure are described. Materials for the anode, the cathode, the EL layer, the charge generation region, the electron-relay layer, and the electron-injection buffer layer are described in this order.

<Material for Anode>

The anode 1101 is preferably formed using a metal, an alloy, an electrically conductive compound, a mixture of these materials, or the like which has a high work function (specifically, a work function of higher than or equal to 4.0 eV is more preferable). Specifically, for example, indium tin oxide (ITO), indium tin oxide containing silicon or silicon oxide, indium zinc oxide (IZO), indium oxide containing tungsten oxide and zinc oxide, and the like are given.

Besides, as a material used for the anode 1101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like.

Note that in the case where a second charge generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge generation region will be subsequently described together with a material for forming the first charge generation region.

<Material for Cathode>

As a material of the cathode 1102, a material having a low work function (specifically, a work function of lower than 4.0 eV) is preferably used; however, in the case where the first charge generation region is provided between the cathode 1102 and the light-emitting unit 1103 to be in contact with the cathode 1102, various electrically conductive materials can be used for the cathode 1102 regardless of their work functions.

Note that at least one of the cathode 1102 and the anode 1101 is formed using a conductive film that transmits visible light. For the conductive film that transmits visible light, for example, indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added can be given. Further, a metal thin film having a thickness enough to transmit light (preferably, approximately from 5 nm to 30 nm) can also be used.

<Material for EL Layer>

Specific examples of materials for the layers included in the light-emitting unit 1103 will be given below.

[Hole-Injection Layer]

The hole-injection layer is a layer having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonate) (PEDOT/PSS), or the like to form the hole-injection layer.

Note that the second charge generation region may be used instead of the hole-injection layer. When the second charge generation region is used, a variety of conductive materials can be used for the anode 1101 regardless of their work functions as described above. A material for forming the second charge generation region will be subsequently described together with a material for forming the first charge generation region.

[Hole-Transport Layer]

The hole-transport layer is a layer that contains a substance with a high hole-transport property. The hole-transport layer is not limited to a single layer, but may be a stacked-layer of two or more layers each containing a substance having a high hole-transport property. The hole-transport layer contains any substance having a higher hole-transport property than an electron-transport property, and preferably contains a substance having a hole mobility of $10^{-6}$ $cm^2/Vs$ or higher because the driving voltage of the light-emitting element can be reduced.

[Light-Emitting Layer]

The light-emitting layer contains a light-emitting substance. The light-emitting layer is not limited to a single layer, but may be a stacked-layer of two or more layers containing light-emitting substances. As the light-emitting substance, a fluorescent compound or a phosphorescent compound can be used. A phosphorescent compound is preferably used as the light-emitting substance because the emission efficiency of the light-emitting element can be increased.

Those light-emitting substances are preferably dispersed in a host material. A host material preferably has higher excitation energy than the light-emitting substance.

[Electron-Transport Layer]

The electron-transport layer is a layer that contains a substance with a high electron-transport property. The electron-transport layer is not limited to a single layer, but may be a stacked-layer of two or more layers each containing a substance having a high electron-transport property. The electron-transport layer contains any substance having a higher electron-transport property than a hole-transport property, and preferably contains a substance having an electron mobility of $10^{-6}$ $cm^2/Vs$ or higher because the driving voltage of the light-emitting element can be reduced.

[Electron-Injection Layer]

The electron-injection layer is a layer including a high electron-injection substance. The electron-injection layer is not limited to a single layer, but may be a stacked-layer of two or more layers containing substances having a high electron-injection property. The electron-injection layer is preferably provided because the efficiency of electron injection from the cathode 1102 can be increased and the driving voltage of the light-emitting element can be reduced.

As the substance having a high electron-injection property, the following can be given: an alkali metal and an alkaline earth metal such as lithium (Li), cesium (Cs), calcium (Ca) and a compound thereof, such as lithium fluoride (LiF), cesium fluoride (CsF), and calcium fluoride ($CaF_2$). Alternatively, a layer containing a substance having an electron-transport property and an alkali metal, an alkaline earth metal, magnesium (Mg), or a compound thereof (e.g., an Alq layer containing magnesium (Mg)) can be used.

<Material for Charge Generation Region>

The first charge generation region 1104c and the second charge generation region are regions containing a substance having a high hole-transport property and an acceptor substance. Note that the charge generation region is not limited to the structure in which one film contains the substance having a high hole-transport property and the acceptor substance, and may be a stacked layer of a layer containing the substance having a high hole-transport property and a layer containing the acceptor substance. Note that in the case where the first charge generation region which is in contact with the cathode has a stacked-layer structure, the layer containing the substance having a high hole-transport property is in contact with the cathode 1102. In the case where the second charge generation region which is in contact with the anode has a stacked-layer structure, the layer containing the acceptor substance is in contact with the anode 1101.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide, particularly an oxide of a metal belonging to Group 4 to 8 of the periodic table is preferred. Specifically, molybdenum oxide is particularly preferable. Note that molybdenum oxide has a low hygroscopic property.

As the substance having a high hole-transport property used for the charge generation region, any of a variety of organic compounds such as an aromatic amine compound, a carbazole derivative, an aromatic hydrocarbon, and a high molecular compound (including an oligomer, a dendrimer, or a polymer) can be used. Specifically, a substance having a hole mobility of $10^{-6}$ cm$^2$/Vs or higher is preferably used. However, other substances than the above-described materials may also be used as long as the substances have higher hole-transport properties than electron-transport properties.

<Material for Electron-Relay Layer>

The electron-relay layer 1104b is a layer that can immediately receive electrons drawn out by the acceptor substance in the first charge generation region 1104c. Therefore, the electron-relay layer 1104b is a layer containing a substance having a high electron-transport property, and the LUMO level thereof is positioned between the acceptor level of the acceptor substance in the first charge generation region 1104c and the LUMO level of the light-emitting unit 1103. Specifically, the LUMO level is preferably about from −5.0 eV to −3.0 eV.

As the substance used for the electron-relay layer 1104b, for example, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or fluorine is preferably used because such a compound further facilitates acceptance of electrons in the electron-relay layer 1104b.

<Material for Electron-Injection Buffer Layer>

The electron-injection buffer layer 1104a is a layer which facilitates electron injection from the first charge generation region 1104c into the light-emitting unit 1103. By providing the electron-injection buffer layer 1104a between the first charge generation region 1104c and the light-emitting unit 1103, the injection barrier therebetween can be reduced.

A substance having a high electron-injection property can be used for the electron-injection buffer layer 1104a. For example, an alkali metal, an alkaline earth metal, a rare earth metal, or a compound thereof (e.g., an alkali metal compound (including an oxide such as lithium oxide, a halide, and carbonate such as lithium carbonate or cesium carbonate), an alkaline earth metal compound (including an oxide, a halide, and carbonate), or a rare earth metal compound (including an oxide, a halide, and carbonate)) can be used.

Further, in the case where the electron-injection buffer layer 1104a contains a substance having a high electron-transport property and a donor substance with respect to the substance having a high electron-transport property, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate). Note that as the substance having a high electron-transport property, a material similar to the above-described material for the electron-transport layer which can be formed in part of the light-emitting unit 1103 can be used.

<Method of Manufacturing Light-Emitting Element>

A method for manufacturing the light-emitting element will be described. Over the first electrode, the layers described above are combined as appropriate to form an EL layer. Various methods (e.g., a dry process or a wet process) can be used to form the EL layer depending on the material for the EL layer. For example, a vacuum evaporation method, an inkjet method, a spin coating method, or the like may be selected. Note that a different method may be employed for each layer. The second electrode is formed over the EL layer, so that the light-emitting element is manufactured.

The light-emitting element described in this embodiment can be fabricated by combination of the above-described materials. Light emission from the above-described light-emitting substance can be obtained with this light-emitting element, and the emission color can be selected by changing the type of the light-emitting substance.

Further, a plurality of light-emitting substances which emit light of different colors can be used, whereby, for example, white light emission can also be obtained by expanding the width of the emission spectrum. In order to obtain white light emission, for example, a structure may be employed in which at least two layers containing light-emitting substances are provided so that light of complementary colors is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light exhibiting blue, green, and red.

This embodiment can be combined with any of the other embodiments disclosed in this specification as appropriate.

Embodiment 4

In this embodiment, electronic devices according to one embodiment of the present invention are described. Specifically, electronic devices each including a display device exemplified in the above embodiments are described with reference to FIGS. 8A to 8E.

Examples of such an electronic device for which a display device according to one embodiment of the present invention is used include: television sets (also called TV or television receivers); monitors for computers or the like; cameras such as digital cameras or digital video cameras; digital photo frames; mobile phones (also called cellular phones or portable telephones); portable game machines; portable information terminals; audio playback devices; and large game machines such as pachinko machines. Specific examples of these electronic devices are illustrated in FIG. 8A to 8E.

Figure 8A:
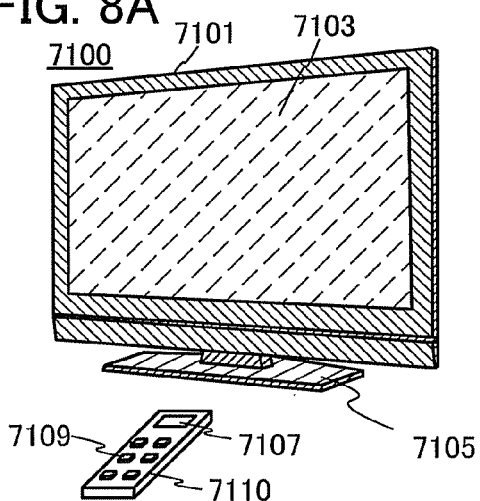
FIGS. 8A to 8E each illustrate an electronic device including a display device according to Embodiment.

FIG. 8A illustrates an example of a television set. In a television set 7100, a display portion 7103 is incorporated in a housing 7101. Images can be displayed on the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. Moreover, when the display device is connected to a communication network with or without wires via the modem, one-way (from a sender to a receiver) or two-way (between a sender and a receiver or between receivers) information communication can be performed.

Figure 8B:
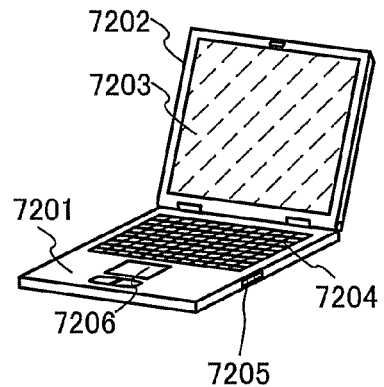

FIG. 8B illustrates a computer, which includes a main body 7201, a housing 7202, a display portion 7203, a keyboard 7204, an external connecting port 7205, a pointing device 7206, and the like. Note that the display device of one embodiment of the present invention is applied to the display portion 7203 in this computer.

Figure 8C:
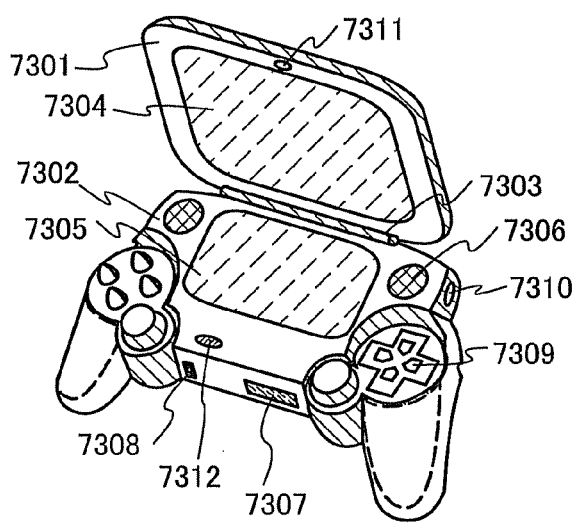

FIG. 8C illustrates a portable game machine, which includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. The portable game console in FIG. 8C also includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), and a microphone 7312), and the like. It is needless to say that the structure of the portable game machine is not limited to the above as long as the display device of one embodiment of the present invention is used for at least either the display portion 7304 or the display portion 7305, or both, and can include other accessories arbitrarily. The portable game console in FIG. 8C has a function of reading a program or data stored in a recording medium to display it on the display portion, and a function of sharing information with another portable game console by wireless communication. The portable game machine in FIG. 8C can have a variety of functions without limitation to the above functions.

Figure 8D:
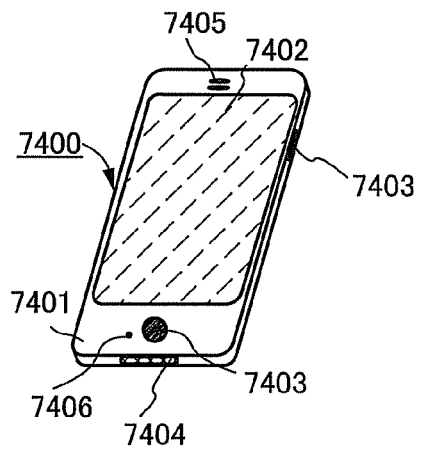

FIG. 8D illustrates an example of a cellular phone. The cellular phone 7400 is provided with a display portion 7402 incorporated in a housing 7401, operation buttons 7403, an external connection port 7404, a speaker 7405, a microphone 7406, and the like. Note that the cellular phone 7400 is manufactured by using the display device of one embodiment of the present invention for the display portion 7402.

When the display portion 7402 of the cellular phone 7400 illustrated in FIG. 8D is touched with a finger or the like, data can be input into the cellular phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted. In this case, it is preferable to display a keyboard or number buttons on almost all the area of the screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 8E:
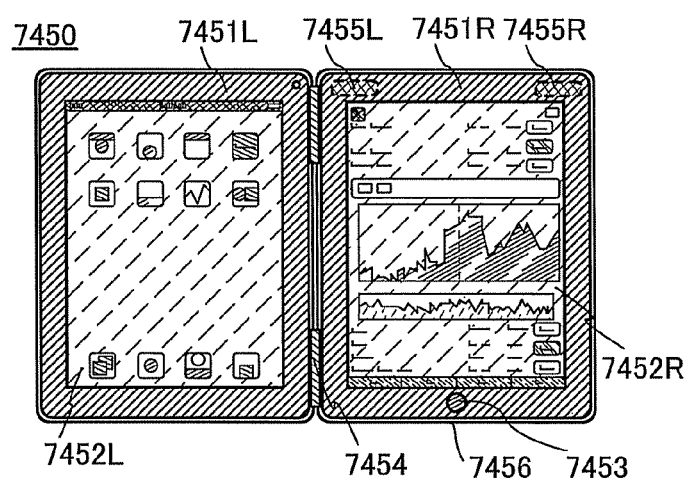

FIG. 8E illustrates an example of a folding computer. A folding computer 7450 includes a housing 7451L and a housing 7451R connected by hinges 7454. The folding computer 7450 further includes an operation button 7453, a left speaker 7455L, and a right speaker 7455R. In addition, a side surface of the folding computer 7450 is provided with an external connection port 7456, which is not illustrated. When the hinge 7454 is folded so that a display portion 7452L provided in the housing 7451L and a display portion 7452R provided in the housing 7451R face each other, the display portions can be protected by the housings. The folding computer 7450 includes the display device of one embodiment of the present invention is applied to at least either the display portion 7452L or the display portion 7452R, or both.

Each of the display portions 7452L and 7452R is a component which can display images and to which information can be input by touch with a finger or the like. For example, the icon for the installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Further, the computer 7450 can also include a gyroscope, an acceleration sensor, a global positioning system (GPS) receiver, fingerprint sensor, or a video camera. For example, a detection device including a sensor which detects inclination, such as a gyroscope or an acceleration sensor, is provided to determine the orientation of the computer 7450 (whether the computer is placed horizontally or vertically for a landscape mode or a portrait mode) so that the orientation of the display screen can be automatically changed.

Furthermore, the computer 7450 can be connected to a network. The computer 7450 not only can display information on the Internet but also can be used as a terminal which controls another electronic device connected to the network from a distant place.

The display device of one embodiment of the present invention includes a display panel in a thin film form. Thus, when the display device is attached to a base with a curved surface, the display device with a curved surface can be obtained. In addition, when the display device is located in a housing with a curved surface, an electronic device with a curved surface can be obtained.

This embodiment can be combined with any of the other embodiments disclosed in this specification as appropriate.

EXAMPLE

A light-emitting module for emitting light exhibiting blue color, a light-emitting module for emitting light exhibiting green color, and a light-emitting module for emitting light exhibiting red color, which are applicable to a display device which is one embodiment of the present invention, were manufactured and the characteristics thereof were measured. The results of the measurement are described below.

<Structure of Light-Emitting Element Manufactured>

Figure 9:
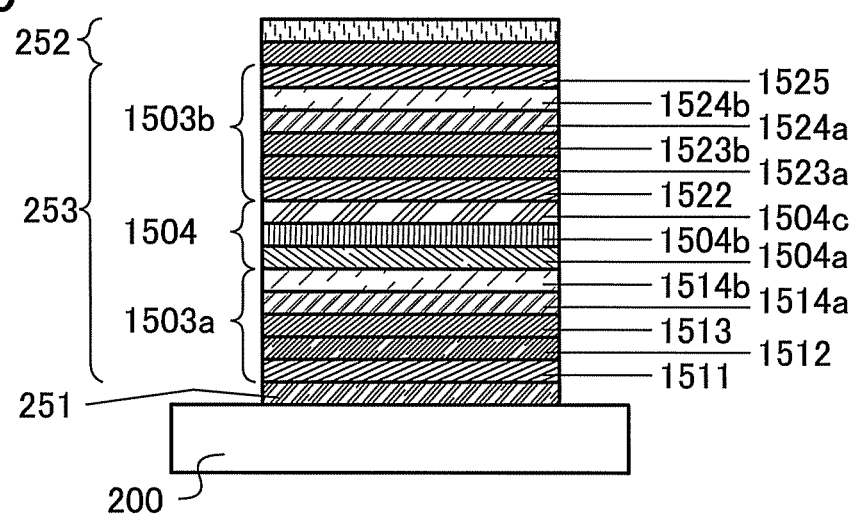
FIG. 9 illustrates a structure of a light-emitting element included in a light-emitting module according to Example.

FIG. 9 shows a structure of a light-emitting element used for the light-emitting modules manufactured. In each of the light-emitting modules manufactured, a first electrode 251 also served as a reflective film, a second electrode 252 also served as a semi-transmissive and semi-reflective film, and a layer 253 containing a light-emitting organic compound was provided between the first electrode and the second electrode.

<<Structure of First Electrode>>

In each of the light-emitting modules, the first electrode 251 also serving as a reflective film was formed using a stack in which a 6-nm-thick titanium film was formed over a 200-nm-thick aluminum-titanium alloy film. As an optical adjustment layer over the reflective film, an indium tin oxide film containing silicon oxide (abbreviation: ITSO) was used. The thickness of the optical adjustment layer was optimized for light emission color.

Specifically, the light-emitting module for emitting light exhibiting green color was provided with a 40-nm-thick ITSO film as the optical adjustment layer, and the light-emitting module for emitting light exhibiting red color was provided with an 80-nm-thick ITSO film as the optical adjustment layer. Note that the light-emitting module for emitting light exhibiting blue color was provided with a layer containing a light-emitting organic compound being in contact with the 6-nm-thick titanium film.

<<Structure of Second Electrode>>

As the second electrode 252, a conductive film in which 70-nm-thick indium tin oxide (abbreviation: ITO) was stacked on a 15-nm-thick silver-magnesium alloy film was used. The silver-magnesium alloy film was fainted by co-evaporation with the weight ratio of 10:1 (=Ag:Mg).

<<Structure of Layer Containing Light-Emitting Organic Compound>>

As illustrated in FIG. 9, a layer 253 containing a light-emitting organic compound had a structure in which two EL layers (a first EL layer 1503a and a second EL layer 1503b) were provided with an interlayer 1504 interposed therebetween (the structure is also referred to as tandem structure).

The first EL layer 1503a included a hole-injection layer 1511, a first hole-transport layer 1512, a first light-emitting layer 1513, a first electron-transport layer 1514a, and a second electron-transport layer 1514b in this order over the first electrode 251.

The interlayer 1504 included an electron-injection buffer layer 1504a, an electron-relay layer 1504b, and a charge-generation region 1504c in this order over the electron-transport layer 1514b.

The second EL layer 1503b included a second hole-transport layer 1522, a second light-emitting layer 1523a, a third light-emitting layer 1523b, a third electron-transport layer 1524a, a fourth electron-transport layer 1524b, and an electron-injection layer 1525 in this order over the interlayer 1504.

Table 1 shows details of materials included in the layer containing a light-emitting organic compound.

TABLE 1

| | First EL layer 1503a | | | | | Interlayer 1504 | | |
|---|---|---|---|---|---|---|---|---|
| | Hole-injection layer 1511 | Hole-transport layer 1512 | Light-emitting layer First 1513 | Electron-transport layer 1514a | Electron-transport layer 1514b | Electron-injection buffer layer 1504a | Electron-relay layer 1504b | Charge-generation region 1504c |
| EL layer | PCzPA:MoOx (=2:1) 10 nm | PCzPA 20 nm | CzPA:1,6-mMemFLPAPrn (=1:0.05) 30 nm | CzPA 5 nm | Bphen 15 nm | Li 0.1 nm | CuPc 2 nm | BPAFLP:MoOx (=2:1) 15 nm |

| | Second EL layer 1503b | | | | | |
|---|---|---|---|---|---|---|
| | Hole-transport layer 1522 | Light-emitting layer | | Electron-transport layer | | Electron-injection layer 1525 |
| | | Second 1523a | Third 1523b | Third 1524a | Fourth 1524b | |
| EL layer | BPAFLP 20 nm | 2mDBTPDBqII:PCBA1BP:Ir(tBppm)2acac 0.8:0.2:0.06 20 nm | 2mDBTPDBqII:Ir(tppr)2dpm 1:0.02 20 nm | 2mDBTPDBqII 15 nm | Bphen 15 nm | LiF 1 nm |

Shown below are structural formulae of some of the organic compounds used in this example.
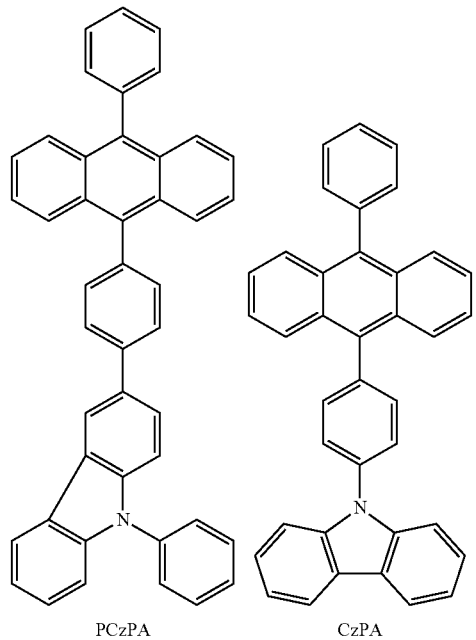
PCzPA  CzPA
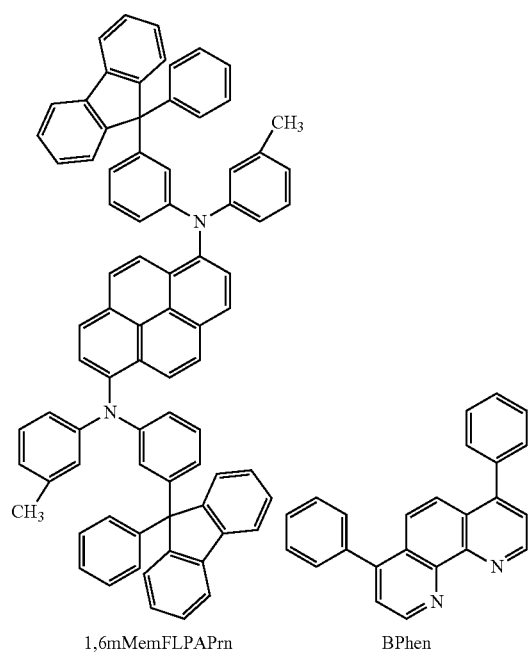
1,6mMemFLPAPrn  BPhen
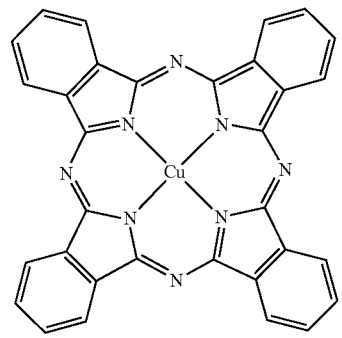
CuPc
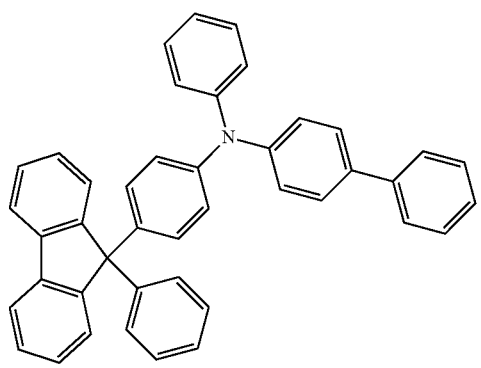
BPAFLP
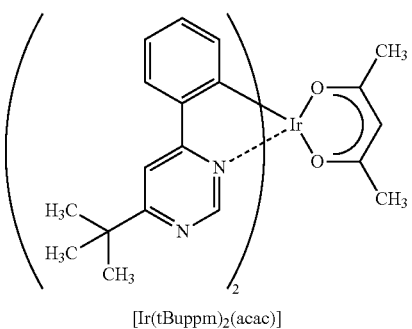
[Ir(tBuppm)₂(acac)]
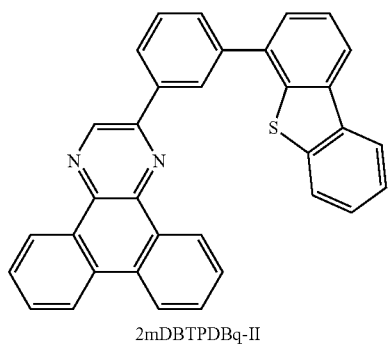
2mDBTPDBq-II -continued

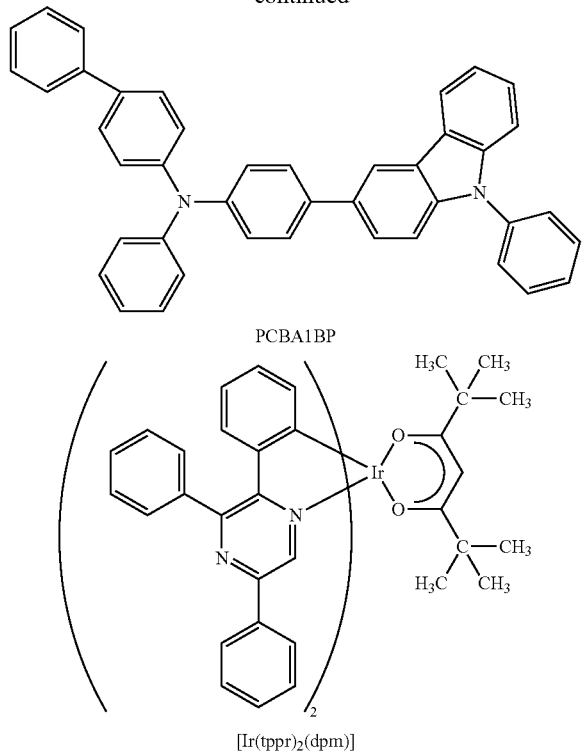

PCBA1BP

[Ir(tppr)₂(dpm)]

<Evaluation Results>

The results of measuring the characteristics of the light-emitting modules manufactured are described below.

<<Emission Spectrum>>

Figure 10A:
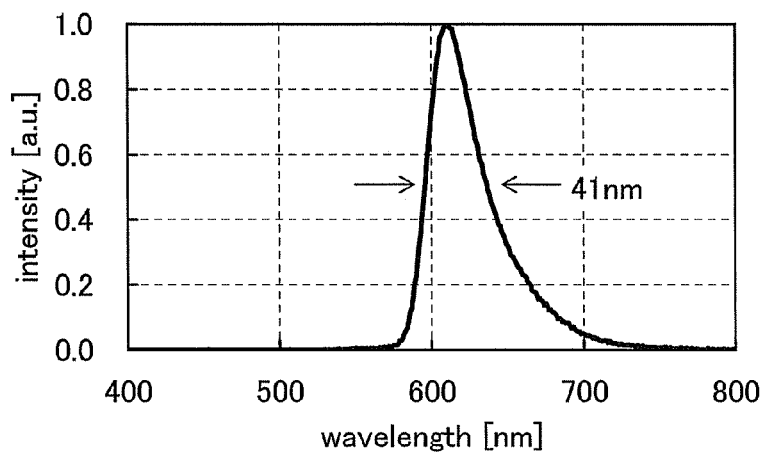
FIGS. 10A to 10C are graphs each showing an emission spectrum of a light-emitting module according to Example.
Figure 10B:
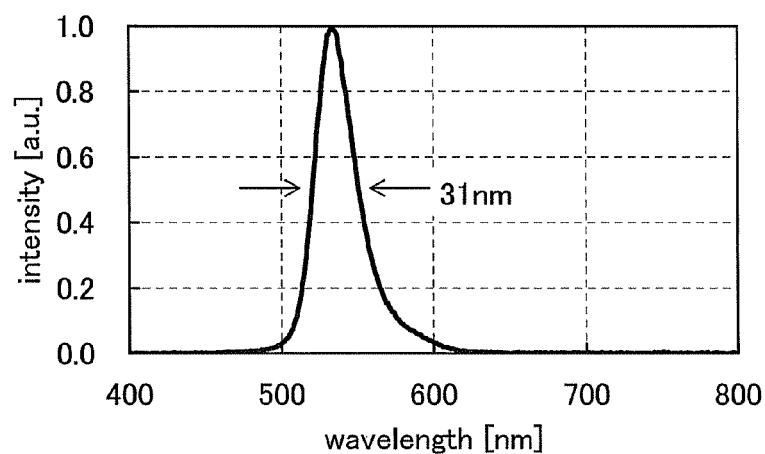
Figure 10C:
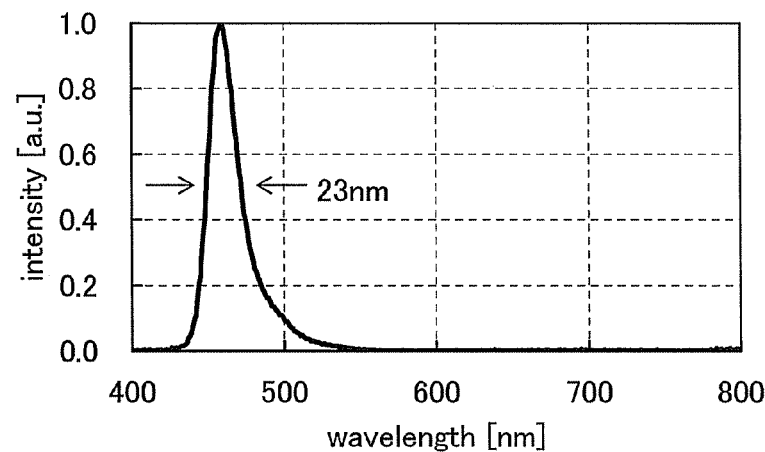

FIGS. 10A to 10C each show the result of measuring the spectrum of light emitted from the light-emitting module manufactured.

FIG. 10A is an emission spectrum of the light-emitting module for emitting light exhibiting red color. The half width of the spectrum was 41 nm.

FIG. 10B is an emission spectrum of the light-emitting module for emitting light exhibiting green color. The half width of the spectrum was 31 nm.

FIG. 10C is an emission spectrum of the light-emitting module for emitting light exhibiting blue color. The half width of the spectrum was 23 nm.

The half width of the spectrum of light emitted from each light-emitting module was narrower than 50 nm, and the light exhibited bright color.

<<Color Reproduction Characteristics>>

Figure 11:
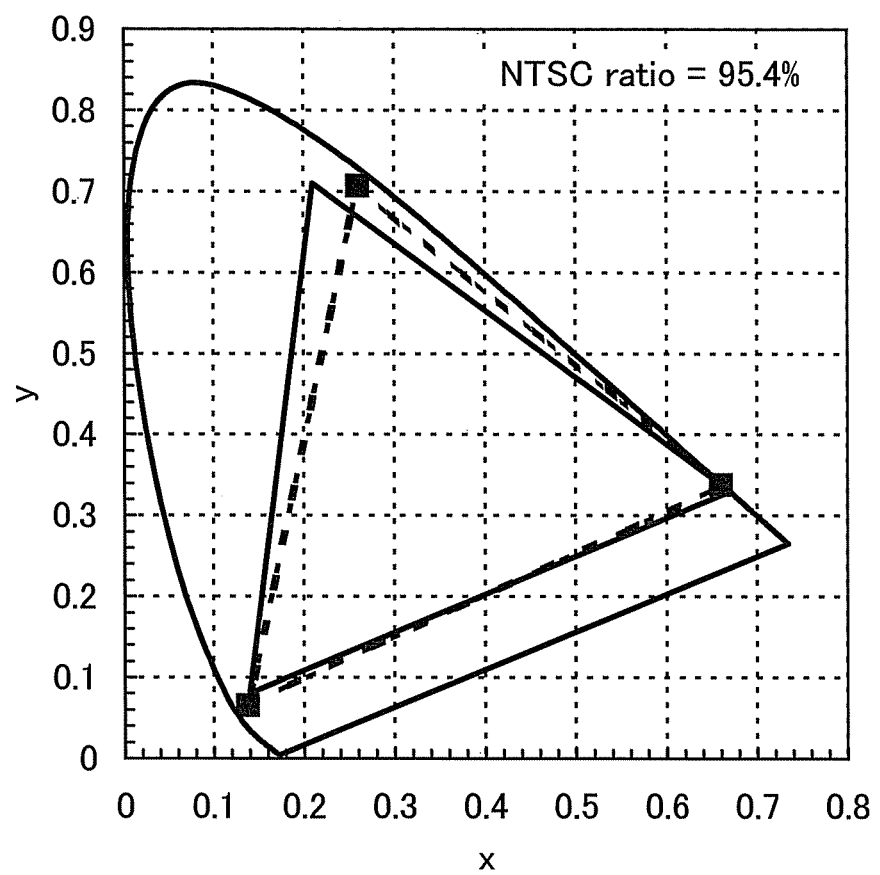
FIG. 11 is a chromaticity diagram in which colors of light emitted from light-emitting modules according to Example are plotted.

FIG. 11 is a chromaticity diagram in which colors of light emitted from the above three light-emitting modules are plotted. A dashed-line triangle whose vertexes correspond to the plotted points represents a range of color which can be displayed using the light-emitting modules. The proportion of the area of the dashed-line triangle in the area of a solid-line triangle whose vertexes are based on National Television System Committee (NTSC) standard was 95.4%.

<<Response Time>>

Figure 12A:
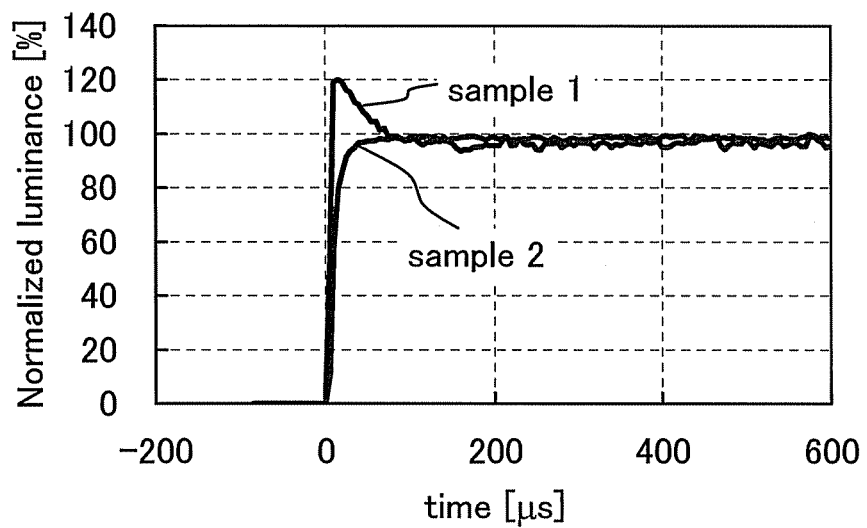
FIGS. 12A and 12B are graphs showing time dependence of luminance emitted from light-emitting modules according to Example.
Figure 12B:
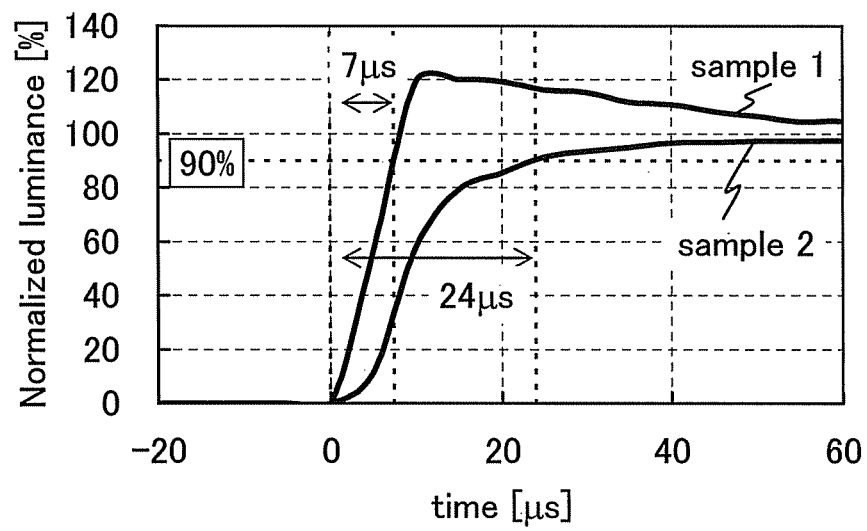

FIG. 12A shows luminance of light emitted from the light-emitting module, with respect to time elapsed from emission start. FIG. 12B is obtained by increasing the scale of the horizontal axis of FIG. 12A. Note that the luminance on the vertical axis represents luminance normalized under the condition that luminance at the time when luminance of light emitted from the light-emitting module becomes stable is regarded as 100%.

Among two kinds of curve in FIGS. 12A and 12B, Sample 1 represents the measurement result of the light-emitting module which emits light exhibiting blue color, and Sample 2 represents the measurement result of the light-emitting module which emits light exhibiting green color.

Response time refers to time from the point when emission started to the point when luminance reached 90%. The response time of Sample 1 was approximately 7 µs, and the response time of Sample 2 was approximately 24 µs. Thus, it can be confirmed that each of the light-emitting modules has a very short response time.

Note that this example can be combined with other embodiments in this specification as appropriate.

EXPLANATION OF REFERENCE

100: display device, 101: display portion, 103: driver circuit portion, 104: driver circuit portion, 105: control circuit portion, 107: image processing device, 109: decoder circuit portion, 111: grayscale conversion portion, 113: memory portion, 114: noise removing portion, 115: pixel-to-pixel complementary portion, 116: tone correction portion, 117: complementary frame generating portion, 251: electrode, 252: electrode, 253: layer, 400: display panel, 402: pixel, 402B: sub pixel, 402G: sub pixel, 402R: sub pixel, 405: sealant, 408: wiring, 410: substrate, 411: transistor, 412: transistor, 413: n-channel transistor, 414: p-channel transistor, 416: insulating layer, 418: partition, 420B: light-emitting element, 420G: light-emitting element, 420R: light-emitting element, 421B: electrode, 421G: electrode, 421R: electrode, 422: electrode, 423: layer, 423a: layer, 423b: layer, 424: interlayer, 431: space, 440: substrate, 441B: color filter, 441G: color filter, 442: film, 450B: light-emitting module, 450G: light-emitting module, 450R: light-emitting module, 1101: anode, 1102: cathode, 1103: light-emitting unit, 1103a: light-emitting unit, 1103b: light-emitting unit, 1104: interlayer, 1104a: electron-injection buffer layer, 1104b: electron-relay layer, 1104c: charge-generation region, 1113: hole-injection layer, 1114: hole-transport layer, 1115: light-emitting layer, 1116: electron-transport layer, 1117: electron-injection layer, 1503a: EL layer, 1503b: EL layer, 1504: interlayer, 1504a: electron-injection buffer layer, 1504b: electron-relay layer, 1504c: charge-generation region, 1511: hole-injection layer, 1512: hole-transport layer, 1513: light-emitting layer, 1514a: electron-transport layer, 1514b: electron-transport layer, 1522: hole-transport layer, 1523a: light-emitting layer, 1523b: light-emitting layer, 1524a: electron-transport layer, 1524b: electron-transport layer, 1525: electron-injection layer, 7100: television set, 7101: housing, 7103: display portion, 7105: stand, 7107: display portion, 7109: operation key, 7110: separate remote controller, 7201: main body, 7202: housing, 7203: display portion, 7204: keyboard, 7205: external connecting port, 7206: pointing device, 7301: housing, 7302: housing, 7303: connection portion, 7304: display portion, 7305: display portion, 7306: speaker portion, 7307: recording medium insertion portion, 7308: LED lamp, 7309: operation key, 7310: connection terminal, 7311: sensor, 7312: microphone, 7400: cellular phone, 7401: housing, 7402: display portion, 7403: operation button, 7404: external connection port, 7405: speaker, 7406: microphone, 7450: computer, 7451L: housing, 7451R: housing, 7452L: display portion, 7452R: display portion, 7453: operation button, 7454: hinge, 7455L: left speaker, 7455R: right speaker, 7456: external connection port.

This application is based on Japanese Patent Application serial No. 2012-087818 filed with Japan Patent Office on Apr. 6, 2012, the entire contents of which are hereby incorporated by reference.

What is claimed is:

1. A display device comprising:
   a grayscale conversion portion; and
   a display portion including a plurality of pixels provided at a resolution of 80 ppi or more, one of the plurality of pixels comprising a light-emitting module capable of emitting light with a spectral line having a peak in which a half width of the peak is 60 nm or less and a transistor including an oxide semiconductor,
   wherein the light-emitting module includes an organic EL element and a color filter,
   wherein the grayscale conversion portion is configured to convert a first image signal inputted to the grayscale conversion portion into a second image signal and transmit the second image signal to the display portion,
   wherein the first image signal has p gray levels (p is a natural number and an even number),
   wherein the second image signal is subjected to a grayscale conversion processing in which each of q gray levels from the lowest gray level to the q-th gray level is further divided into $2^r$ gray levels, and
   wherein q is greater than or equal to 1 and less than or equal to p/2 and r is greater than or equal to 1 and less than or equal to 20.

2. The display device according to claim 1,
   wherein the grayscale conversion portion is configured to divide an image contained in the first image signal into a plurality of regions, extract luminance distribution in each of the plurality of regions, determine whether to perform the grayscale conversion processing in each of the plurality of regions based on the luminance distribution, and perform the grayscale conversion processing to a region which needs the grayscale conversion processing.

3. The display device according to claim 1,
   wherein the organic EL element is one of a first organic EL element, a second organic EL element, and a third organic EL element,
   wherein the first organic EL element comprises:
      a first reflective film;
      a first light-emitting layer over the first reflective film;
      an interlayer over the first light-emitting layer;
      a second light-emitting layer over the interlayer; and
      a semi-transmissive and semi-reflective film over the second light-emitting layer,
      wherein a first optical path length between the first reflective film and the semi-transmissive and semi-reflective film is adjusted to i/2 times (i is a natural number) the length greater than or equal to 600 nm and less than 800 nm,
   wherein a first color filter for transmitting light exhibiting red color is provided over the first organic EL element,
   wherein the second organic EL element comprises:
      a second reflective film;
      the first light-emitting layer over the second reflective film;
      the interlayer over the first light-emitting layer;
      the second light-emitting layer over the interlayer; and
      the semi-transmissive and semi-reflective film over the second light-emitting layer,
      wherein a second optical path length between the second reflective film and the semi-transmissive and semi-reflective film is adjusted to j/2 times (j is a natural number) the length greater than or equal to 500 nm and less than 600 nm, and
   wherein a second color filter for transmitting light exhibiting green color is provided over the second organic EL element,
   wherein the third organic EL element comprises:
      a third reflective film;
      the first light-emitting layer over the third reflective film;
      the interlayer over the first light-emitting layer;
      the second light-emitting layer over the interlayer; and
      the semi-transmissive and semi-reflective film over the second light-emitting layer,
      wherein a third optical length between the third reflective film and the semi-transmissive and semi-reflective film is adjusted to k/2 times (k is a natural number) the length greater than or equal to 400 nm and less than 500 nm, and
   wherein a third color filter for transmitting light exhibiting blue color is provided over the third organic EL element.

4. The display device according to claim 1,
   wherein the organic EL element is one of a first organic EL element, a second organic EL element, and a third organic EL element,
   wherein the first organic EL element comprises:
      a first reflective film;
      a first electrode over the first reflective film;
      a first light-emitting layer over the first electrode;
      an interlayer over the first light-emitting layer;
      a second light-emitting layer over the interlayer; and
      a semi-transmissive and semi-reflective film over the second light-emitting layer,
   wherein a first color filter for transmitting light exhibiting red color is provided over the first organic EL element,
   wherein the second organic EL element comprises:
      a second reflective film;
      a second electrode over the second reflective film;
      the first light-emitting layer over the second electrode;
      the interlayer over the first light-emitting layer;
      the second light-emitting layer over the interlayer; and
      the semi-transmissive and semi-reflective film over the second light-emitting layer,
   wherein a second color filter for transmitting light exhibiting green color is provided over the second organic EL element,
   wherein the third organic EL element comprises:
      a third reflective film;
      a third electrode over the third reflective film;
      the first light-emitting layer over the third electrode;
      the interlayer over the first light-emitting layer;
      the second light-emitting layer over the interlayer; and
      the semi-transmissive and semi-reflective film over the second light-emitting layer,
   wherein a third color filter for transmitting light exhibiting blue color is provided over the third organic EL element.

5. The display device according to claim 1,
   wherein the organic EL element comprises:
      a reflective film;
      a first light-emitting layer over the reflective film;
      an interlayer over the first light-emitting layer;

a second light-emitting layer over the interlayer; and
a semi-transmissive and semi-reflective film over the second light-emitting layer,
wherein the light-emitting module is configured to emit light that exhibits red and the half width of the peak is less than 50 nm,
wherein the color filter is for transmitting light exhibiting red color and provided over the organic EL element.

6. An electronic device comprising the display device according to claim 1.

7. The display device according to claim 1,
wherein the oxide semiconductor include c-axis aligned crystal.

8. The display device according to claim 1,
wherein a region where a channel of the transistor is formed in the oxide semiconductor is a single crystal semiconductor.

9. The display device according to claim 1,
wherein the resolution is 300 ppi or higher.

10. The display device according to claim 1,
wherein the display portion has a contrast ratio of 2000 or higher.

11. A display device comprising:
a display portion comprising a plurality of pixels;
one of the plurality of pixels comprising:
a light-emitting module including an organic EL element and a color filter, the light-emitting module capable of emitting light with a spectral line having a peak in which a half width of the peak is 60 nm or less; and
transistor including an oxide semiconductor, and
a grayscale conversion portion,
wherein the display portion has an NTSC ratio of 80% or higher and a contrast ratio of 500 or higher,
wherein the plurality of pixels are provided at a resolution of 80 ppi or more,
wherein the grayscale conversion portion is configured to convert a first image signal inputted to the grayscale conversion portion into a second image signal and transmit the second image signal to the display portion,
wherein the first image signal has p gray levels (p is a natural number and an even number),
wherein the second image signal is subjected to a grayscale conversion processing in which each of q gray levels from the lowest gray level to the q-th gray level is further divided into $2^r$ gray levels, and
wherein q is greater than or equal to 1 and less than or equal to p/2 and r is greater than or equal to 1 and less than or equal to 20.

12. The display device according to claim 11,
wherein the grayscale conversion portion is configured to divide an image contained in the first image signal into a plurality of regions, extract luminance distribution in each of the plurality of regions, determine whether to perform the grayscale conversion processing in each of the plurality of regions based on the luminance distribution, and perform the grayscale conversion processing to a region which needs the grayscale conversion processing.

13. The display device according to claim 11,
wherein the organic EL element is one of a first organic EL element, a second organic EL element, and a third organic EL element,
wherein the first organic EL element comprises:
a first reflective film;
a first light-emitting layer over the first reflective film;
an interlayer over the first light-emitting layer;
a second light-emitting layer over the interlayer; and
a semi-transmissive and semi-reflective film over the second light-emitting layer,
wherein a first optical path length between the first reflective film and the semi-transmissive and semi-reflective film is adjusted to i/2 times (i is a natural number) the length greater than or equal to 600 nm and less than 800 nm,
wherein a first color filter for transmitting light exhibiting red color is provided over the first organic EL element,
wherein the second organic EL element comprises:
a second reflective film;
the first light-emitting layer over the second reflective film;
the interlayer over the first light-emitting layer;
the second light-emitting layer over the interlayer; and
the semi-transmissive and semi-reflective film over the second light-emitting layer,
wherein a second optical path length between the second reflective film and the semi-transmissive and semi-reflective film is adjusted to j/2 times (j is a natural number) the length greater than or equal to 500 nm and less than 600 nm,
wherein a second color filter for transmitting light exhibiting green color is provided over the second organic EL element,
wherein the third organic EL element comprises:
a third reflective film;
the first light-emitting layer over the third reflective film;
the interlayer over the first light-emitting layer;
the second light-emitting layer over the interlayer;
the semi-transmissive and semi-reflective film over the second light-emitting layer,
wherein a third optical length between the third reflective film and the semi-transmissive and semi-reflective film is adjusted to k/2 times (k is a natural number) the length greater than or equal to 400 nm and less than 500 nm, and
wherein a third color filter for transmitting light exhibiting blue color is provided over the third organic EL element.

14. The display device according to claim 11,
wherein the organic EL element is one of a first organic EL element, a second organic EL element, and a third organic EL element,
wherein the first organic EL element comprises:
a first reflective film;
a first electrode over the first reflective film;
a first light-emitting layer over the first electrode;
an interlayer over the first light-emitting layer;
a second light-emitting layer over the interlayer; and
a semi-transmissive and semi-reflective film over the second light-emitting layer,
wherein a first color filter for transmitting light exhibiting red color is provided over the first organic EL element,
wherein the second organic EL element comprises:
a second reflective film;
a second electrode over the second reflective film;
the first light-emitting layer over the second electrode;
the interlayer over the first light-emitting layer;
the second light-emitting layer over the interlayer; and
the semi-transmissive and semi-reflective film over the second light-emitting layer
wherein a second color filter for transmitting light exhibiting green color is provided over the second organic EL element wherein the third organic EL element comprises:
a third reflective film;
a third electrode over the third reflective film;
the first light-emitting layer over the third electrode;
the interlayer over the first light-emitting layer;
the second light-emitting layer over the interlayer; and
the semi-transmissive and semi-reflective film over the second light-emitting layer,
wherein a third color filter for transmitting light exhibiting blue color is provided over the third organic EL element.

15. The display device according to claim 11,
wherein the organic EL element comprises:
a reflective film;
a first light-emitting layer over the reflective film;
an interlayer over the first light-emitting layer;
a second light-emitting layer over the interlayer; and
a semi-transmissive and semi-reflective film over the second light-emitting layer, semi reflective film,
wherein the light-emitting module is configured to emit light that exhibits red and the half width of the peak is less than 50 nm
wherein the color filter is for transmitting light exhibiting red color and provided over the organic EL element.

16. An electronic device comprising the display device according to claim 11.

17. The display device according to claim 11,
wherein the oxide semiconductor include c-axis aligned crystal.

18. The display device according to claim 11,
wherein a region where a channel of the transistor is formed in the oxide semiconductor is a single crystal semiconductor.

19. The display device according to claim 11,
wherein the resolution is 300 ppi or higher.

20. The display device according to claim 11,
wherein the contrast ratio is 2000 or higher.

21. A display device comprising:
a grayscale conversion portion; and
a display portion comprising a plurality of pixels,
wherein one of the plurality of pixels comprising a first light-emitting module including a first organic EL element and a first color filter, a second light-emitting module including a second organic EL element and a second color filter, and a third light-emitting module including a third organic EL element and a third color filter, which are capable of emitting light with a spectral line having a peak in which a half width of the peak is 60 nm or less, and a transistor including an oxide semiconductor,
wherein the display portion has an NTSC ratio of 80% or higher and a contrast ratio of 500 or higher,
wherein the plurality of pixels are provided at a resolution of 80 ppi or more,
wherein the grayscale conversion portion is configured to convert a first image signal inputted to the grayscale conversion portion into a second image signal and transmit the second image signal to the display portion,
wherein the first image signal has p gray levels (p is a natural number and an even number),
wherein the second image signal is subjected to a grayscale conversion processing in which each of q gray levels from the lowest gray level to the q-th gray level is further divided into $2^r$ gray levels, and
wherein q is greater than or equal to 1 and less than or equal to p/2 and r is greater than or equal to 1 and less than or equal to 20.

22. The display device according to claim 21,
wherein the grayscale conversion portion is configured to divide an image contained in the first image signal into a plurality of regions, extract luminance distribution in each of the plurality of regions, determine whether to perform the grayscale conversion processing in each of the plurality of regions based on the luminance distribution, and perform the grayscale conversion processing to a region which needs the grayscale conversion processing.

23. The display device according to claim 21,
wherein the first organic EL element comprises:
a first reflective film;
a first light-emitting layer over the first reflective film;
an interlayer over the first light-emitting layer;
a second light-emitting layer over the interlayer; and
a semi-transmissive and semi-reflective film over the second light-emitting layer,
wherein a first optical path length between the first reflective film and the semi-transmissive and semi-reflective film is adjusted to i/2 times (i is a natural number) the length greater than or equal to 600 nm and less than 800 nm,
wherein the first color filter is for transmitting light exhibiting red color and provided over the first organic EL element,
wherein the second organic EL element comprises:
a second reflective film;
the first light-emitting layer over the second reflective film;
the interlayer over the first light-emitting layer;
the second light-emitting layer over the interlayer; and
the semi-transmissive and semi-reflective film over the second light-emitting layer,
wherein a second optical path length between the second reflective film and the semi-transmissive and semi-reflective film is adjusted to j/2 times (j is a natural number) the length greater than or equal to 500 nm and less than 600 nm, and
wherein the second color filter is for transmitting light exhibiting green color and provided over the second organic EL element,
wherein the third organic EL element comprises:
a third reflective film;
the first light-emitting layer over the third reflective film;
the interlayer over the first light-emitting layer;
the second light-emitting layer over the interlayer;
the semi-transmissive and semi-reflective film over the second light-emitting layer,
wherein a third optical length between the third reflective film and the semi-transmissive and semi-reflective film is adjusted to k/2 times (k is a natural number) the length greater than or equal to 400 nm and less than 500 nm
wherein the third color filter is for transmitting light exhibiting blue color and provided over the third organic EL element.

24. The display device according to claim 21,
wherein the first organic EL element comprises:
a first reflective film;
a first electrode over the first reflective film;
a first light-emitting layer over the first electrode;
an interlayer over the first light-emitting layer;
a second light-emitting layer over the interlayer; and
a semi-transmissive and semi-reflective film over the second light-emitting layer, wherein the first color filter is for transmitting light exhibiting red color and provided over the first organic EL element
wherein the second organic EL element comprises:
   a second reflective film;
   a second electrode over the second reflective film;
   the first light-emitting layer over the second electrode;
   the interlayer over the first light-emitting layer;
   the second light-emitting layer over the interlayer; and
   the semi-transmissive and semi-reflective film over the second light-emitting layer,
wherein the second color filter is for transmitting light exhibiting green color and provided over the second organic EL element
wherein the third organic EL element comprises:
   a third reflective film;
   a third electrode over the third reflective film;
   the first light-emitting layer over the third electrode;
   the interlayer over the first light-emitting layer;
   the second light-emitting layer over the interlayer; and
   the semi-transmissive and semi-reflective film over the second light-emitting layer,
wherein the third color filter is for transmitting light exhibiting blue color and provided over the third organic EL element.

25. The display device according to claim 24,
wherein the first light-emitting module is configured to emit light that exhibits red and has a first spectral line having a first peak in which a first half width of the first peak is less than 50 nm,
wherein the second light-emitting module is configured to emit light that exhibits green and has a second spectral line having a second peak in which a second half width of the second peak is narrower than the first half width, and
wherein the third light-emitting module is configured to emit light that exhibits blue and has a third spectral line having a third peak in which a third half width of the third peak is narrower than the second half width.

26. An electronic device comprising the display device according to claim 21.

27. The display device according to claim 21,
wherein the oxide semiconductor include c-axis aligned crystal.

28. The display device according to claim 21,
wherein a region where a channel of the transistor is formed in the oxide semiconductor is a single crystal semiconductor.

29. The display device according to claim 21,
wherein the resolution is 300 ppi or higher.

30. The display device according to claim 21,
wherein the contrast ratio is 2000 or higher.

* * * * *

UNITED STATES PATENT AND TRADEMARK OFFICE
CERTIFICATE OF CORRECTION

PATENT NO. : 9,711,110 B2
APPLICATION NO. : 13/833870
DATED : July 18, 2017
INVENTOR(S) : Shunpei Yamazaki et al.

Page 1 of 1

It is certified that error appears in the above-identified patent and that said Letters Patent is hereby corrected as shown below:

In the Specification

Column 2, Line 64; Change "hasp gray" to --has p gray--.

Column 3, Line 57; Change "hasp gray" to --has p gray--.

Column 30, Line 17; Change "fainted" to --formed--.

In the Claims

Column 39, Line 19, Claim 15; Change "second light-emitting layer, semi-reflective film," to --second light-emitting layer,--.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*